(12) United States Patent
Zaato et al.

(10) Patent No.: US 12,251,921 B2
(45) Date of Patent: Mar. 18, 2025

(54) TECHNIQUES FOR FABRICATING AND SEPARATING FLEXIBLE MICROELECTRONICS DEVICES FROM RIGID SUBSTRATES

(71) Applicant: OMNIPLY TECHNOLOGIES INC., Montreal (CA)

(72) Inventors: Francis Zaato, Montreal (CA); Humaira Taz, Montreal (CA); Avinash Nanayakkara, Montreal (CA); Harit Doshi, Montreal (CA)

(73) Assignee: Omniply Technologies, Inc., Montreal (CA)

( * ) Notice: Subject to any disclaimer, the term of this patent is extended or adjusted under 35 U.S.C. 154(b) by 0 days.

(21) Appl. No.: 18/296,465

(22) Filed: Apr. 6, 2023

(65) Prior Publication Data

US 2023/0245913 A1 Aug. 3, 2023

Related U.S. Application Data

(63) Continuation of application No. PCT/CA2021/051388, filed on Oct. 5, 2021.
(Continued)

(51) Int. Cl.
*B32B 7/06* (2019.01)
*B32B 17/10* (2006.01)

(52) U.S. Cl.
CPC ............. *B32B 7/06* (2013.01); *B32B 17/10* (2013.01); *B32B 2264/10* (2013.01)

(58) Field of Classification Search
CPC ........ B32B 7/06; B32B 17/10; B32B 2264/10
(Continued)

(56) References Cited

U.S. PATENT DOCUMENTS 8,815,707 B2   8/2014   Lee et al.
9,337,169 B2   5/2016   Lee et al.
(Continued)

FOREIGN PATENT DOCUMENTS

EP   2034810 A1   3/2009
EP   2398041 A1   12/2011
(Continued)

OTHER PUBLICATIONS

Transfer Printing Methods for Flexible Thin Film Solar Cells: Basic Concepts and Working Principles, Lee et al., ACS Nano, 2014.
(Continued)

*Primary Examiner* — Betelhem Shewareged
(74) *Attorney, Agent, or Firm* — Volpe Koenig

(57) ABSTRACT

A laminate structure and a method used in the manufacturing of flexible electronics or microelectronic devices are provided. The laminate structure comprises a rigid substrate, a flexible microelectronics structure comprising and a debonding structure provided between the rigid substrate and the flexible microelectronics structure. The debonding structure comprises at least one debonding layer made of a non-metallic inorganic material. The laminate structure comprises first and second peeling surfaces, where at least one of the peeling surfaces corresponding to a surface of the debonding structure or to a surface within the debonding structure. The first and second peeling surfaces are peelable by a debonding force resulting from a mechanical delamination and/or from a pressurized fluid delamination, allowing separating the flexible microelectronic device from the rigid substrate.

20 Claims, 18 Drawing Sheets

Related U.S. Application Data

(60) Provisional application No. 63/088,133, filed on Oct. 6, 2020, provisional application No. 63/088,150, filed on Oct. 6, 2020.

(58) Field of Classification Search
USPC .................................................. 428/195.1
See application file for complete search history.

(56) References Cited

U.S. PATENT DOCUMENTS

| | | | |
|---|---|---|---|
| 9,947,568 | B2 | 4/2018 | Yasumoto et al. |
| 2003/0038166 | A1* | 2/2003 | Gasse .................. C04B 37/006 228/247 |
| 2008/0131665 | A1* | 6/2008 | Suyama ................ B82Y 30/00 428/149 |
| 2010/0035407 | A1 | 2/2010 | Goto et al. |
| 2011/0311789 | A1 | 12/2011 | Loy et al. |
| 2014/0234664 | A1 | 8/2014 | Yasumoto et al. |
| 2015/0307732 | A1* | 10/2015 | Chen .................... C09D 133/06 156/247 |
| 2016/0021732 | A1 | 1/2016 | Zhou |
| 2016/0332415 | A1 | 11/2016 | Lyons et al. |
| 2017/0120569 | A1 | 5/2017 | Liu et al. |
| 2019/0305239 | A1 | 10/2019 | Reit et al. |
| 2020/0180259 | A1 | 6/2020 | Okuyama et al. |
| 2023/0245913 | A1* | 8/2023 | Zaato ....................... B32B 7/06 |

FOREIGN PATENT DOCUMENTS

| | | |
|---|---|---|
| EP | 3159919 B1 | 8/2021 |
| JP | 2020042277 A | 3/2020 |

OTHER PUBLICATIONS

Peel-and-Stick: Fabricating Thin Film Solar Cell on Universal Substrates, Lee et al., Sci rep., 2012.

Wafer-recyclable, environment-friendly transfer printing for large-scale thin-film nanoelectronics, Wie et al, PMAS, 2018.

Fabrication of Nanowire Electronics on Nonconventional Substrates by Water-Assisted Transfer Printing Method, Lee et al, Nano Letters, 2011.

* cited by examiner

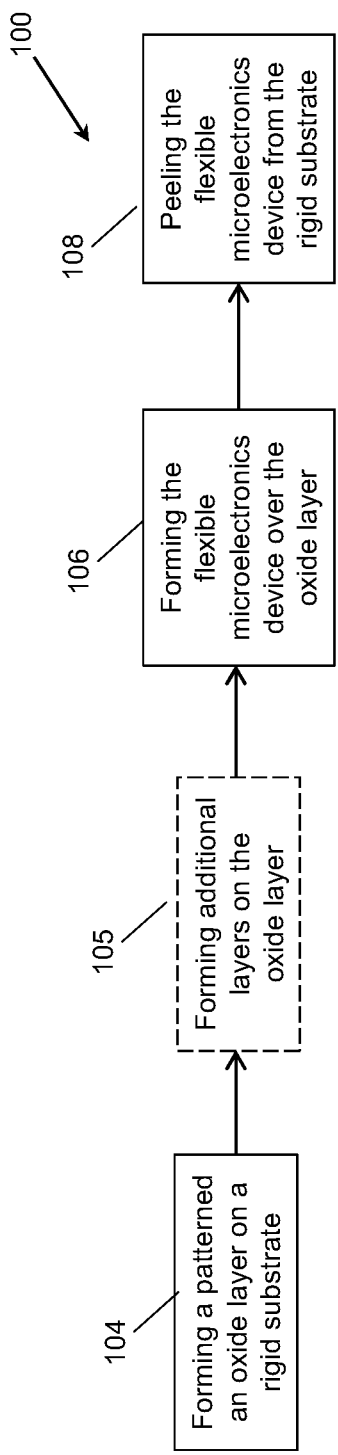
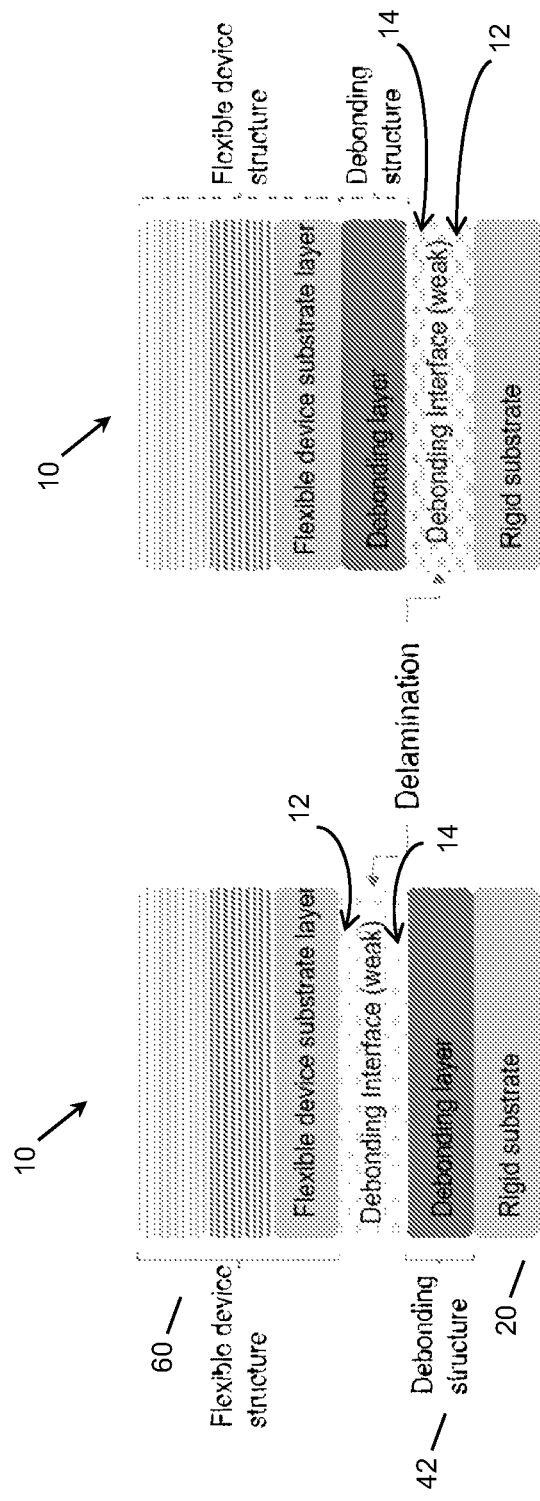
FIG. 2A
FIG. 2B
FIG. 2C

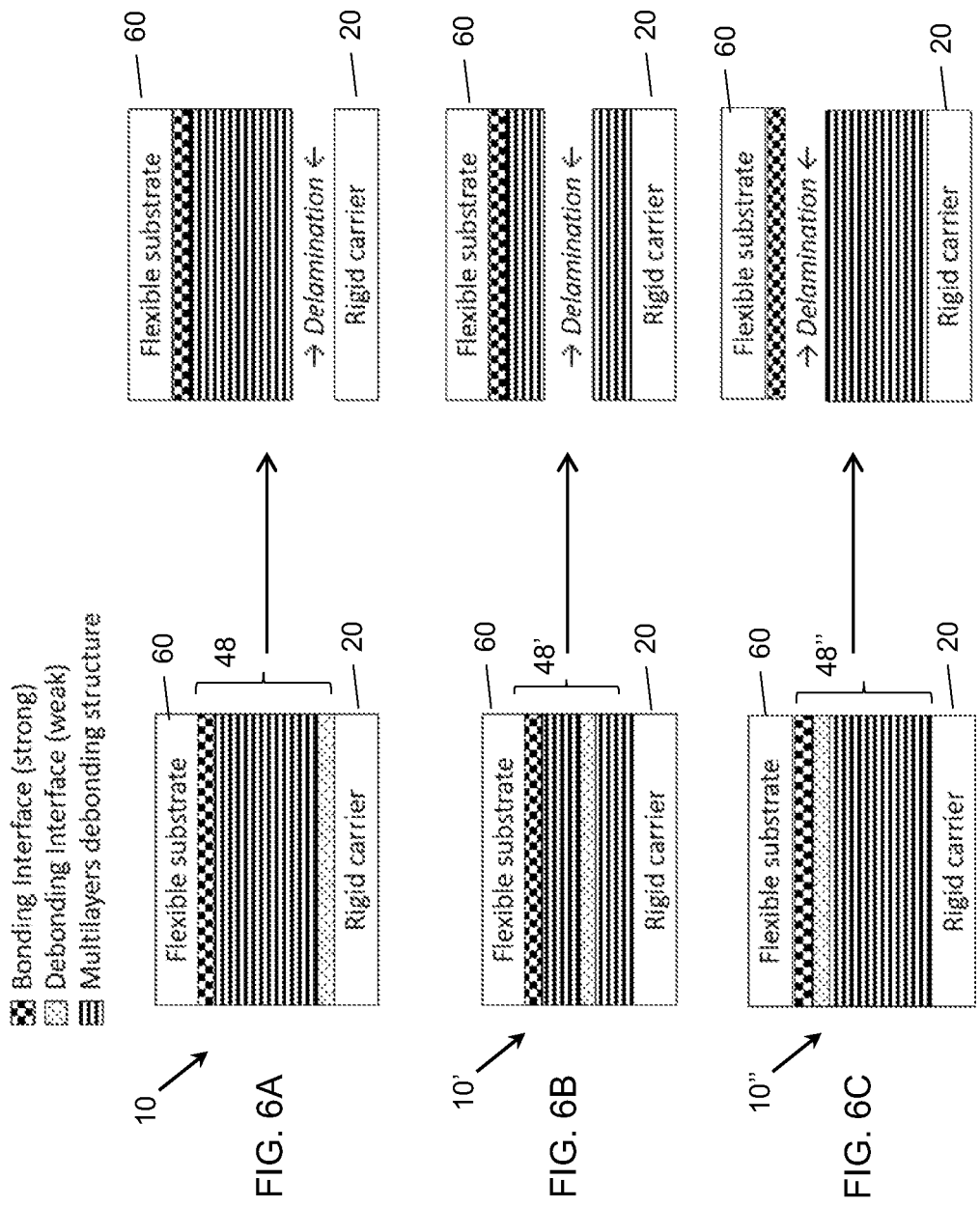

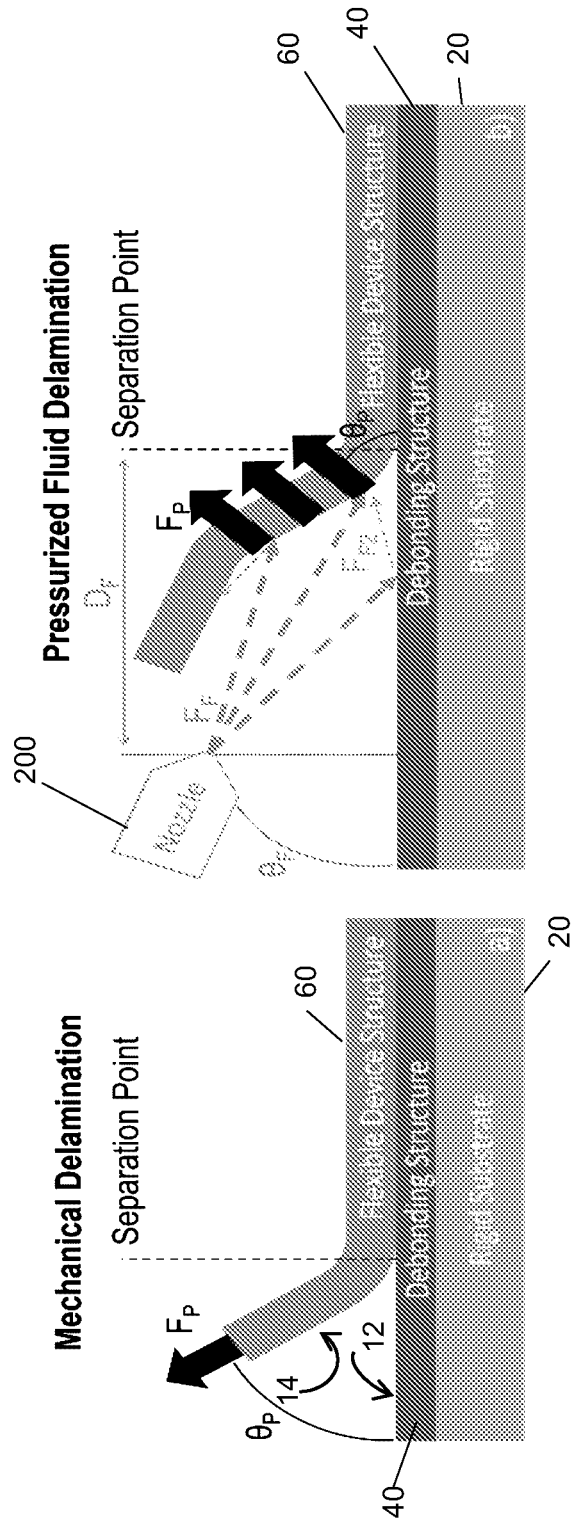

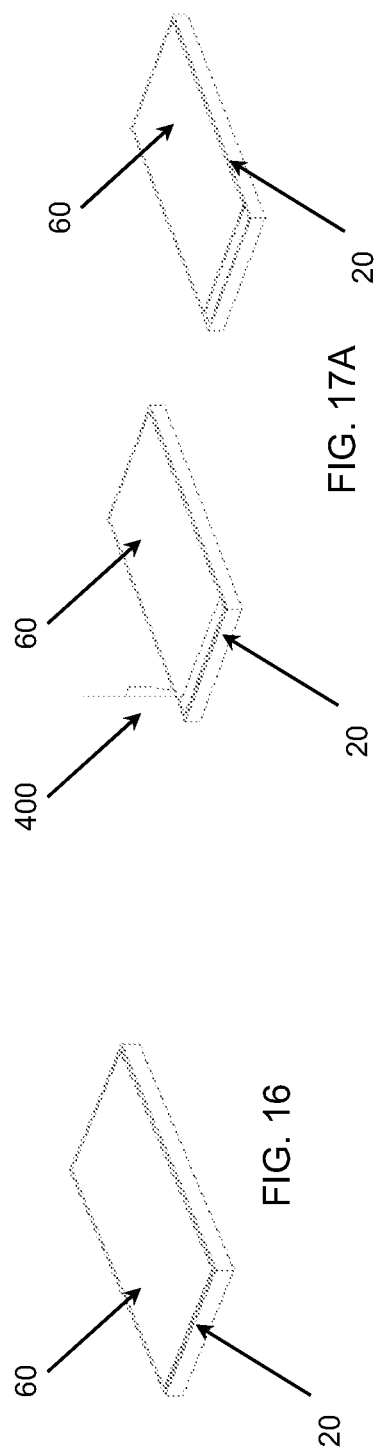
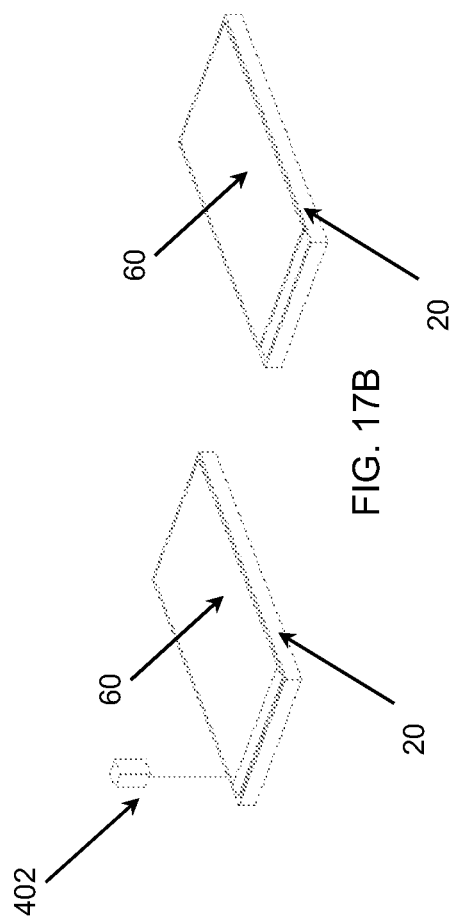
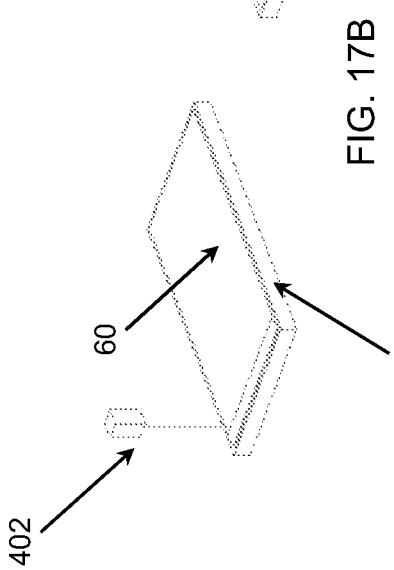

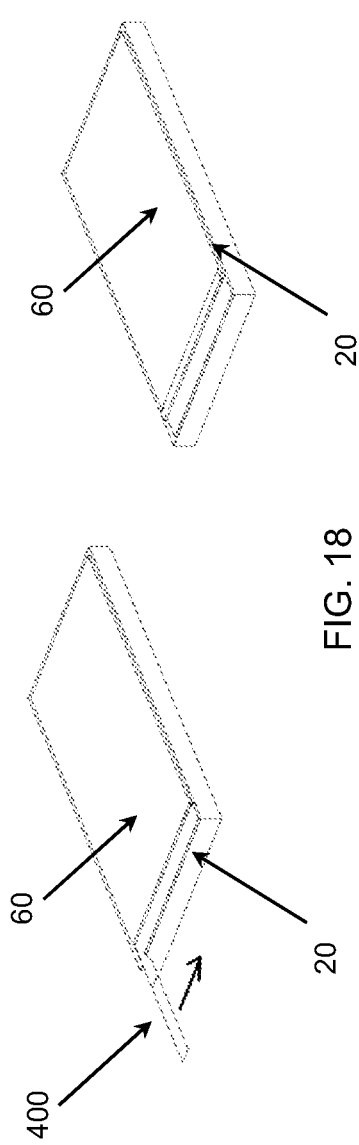
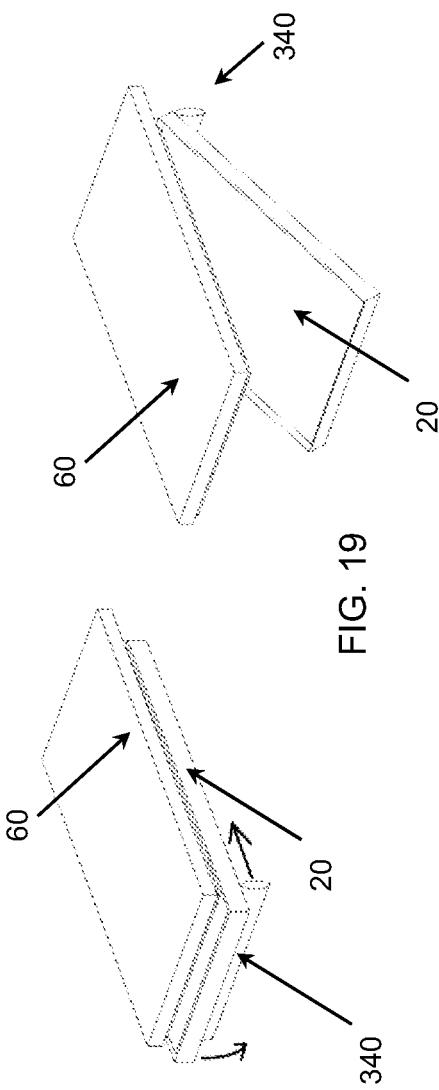
FIG. 18
FIG. 19

TECHNIQUES FOR FABRICATING AND SEPARATING FLEXIBLE MICROELECTRONICS DEVICES FROM RIGID SUBSTRATES

RELATED APPLICATIONS

This application claims priority to U.S. Application Ser. No. 63/088,133 and to U.S. Application Ser. No. 63/088,150, both filed on Oct. 6, 2020, the contents of which are incorporated herein by reference. This application is a bypass continuation of PCT/CA2021/051388, filed Oct. 5, 2021, which is also incorporated therein.

TECHNICAL FIELD

The technical field generally relates to the field of flexible electronics, and more particularly relates to techniques for manufacturing flexible electronics or microelectronic structures and/or for separating flexible microelectronics structures from rigid substrates.

BACKGROUND

The manufacturing process of electronic components used in the field of flexible electronics (e.g., transistors, capacitors, diodes, and the like) generally includes strongly bonding a flexible substrate or a polymer substrate (e.g., PET, PEN, PI and the like) to a rigid substrate (e.g., glass, silicon wafer, $SiO_2$/silicon wafer and the like). Upon completion of the manufacturing process, the flexible substrate or polymer substrate typically needs to be released or debonded from the rigid carrier substrate. Existing methods are known to be expensive and complex, thus leading to a relatively low yield.

Challenges still exist in the field of flexible electronics, the implementation of flexible layers and/or substrates in different devices, as well as methods for manufacturing the same.

SUMMARY

According to another aspect, a laminate structure used in the manufacturing of microelectronic and/or electronic devices is provided. The laminate structure comprises a first rigid substrate; a second thin substrate, the second thin substrate being thinner than the rigid substrate; a debonding structure provided between the rigid substrate and the second thin substrate. The laminate structure comprises first and second peeling surfaces, at least one of the peeling surfaces corresponding to a surface of the debonding structure or to a surface within the debonding structure, the first and second peeling surfaces being peelable by a debonding force resulting from a mechanical delamination and/or from a pressurized fluid delamination, allowing separating the second thin substrate from the first rigid substrate.

In possible embodiments, the rigid substrate comprises at least one of: silicon, alumina, steel, sapphire, gallium nitride, silicon carbide and glass.

In possible embodiments, the at least one debonding layer of the debonding structure is a single debonding layer comprising one of: an oxide, a nitride, a carbide and an oxynitride. The single layer can comprise one of: silicon dioxide, silicon nitride, silicon carbide and silicon oxynitride. Preferably, the single layer has a thickness of 20 µm or less, and optionally 15 µm or less.

In possible embodiments, the first peeling surface corresponds to the top surface of the debonding structure and the second peeling surface corresponds to a bottom surface of the flexible microelectronics structure. In other possible embodiments, the first peeling surface corresponds to the bottom surface of the debonding structure, and the second peeling surface corresponds to a top surface of the rigid substrate.

In possible embodiments, the debonding structure comprises at least a first debonding layer and a second debonding layer, the peeling interface being formed within the debonding structure.

In possible embodiments, one of the first and second debonding layers comprises a metal or a metallic alloy; and the other one of the first and second debonding layers comprises one of: an oxide, a nitride, a carbide and an oxynitride. The metal or metal alloy can comprise one of: Ni, Al, Cu or Pd or an alloy thereof. The other debonding layer can comprise one of: silicon dioxide, silicon nitride, silicon carbide and silicon oxynitride. The first debonding layer can be formed on the rigid substrate and the second debonding layer is formed on top of the first debonding layer. Preferably, the second debonding layer as a thickness of 20 µm or less.

In possible embodiments, at least one debonding layer comprises a patterned layer comprising a plurality of patterns. The plurality of patterns may be evenly distributed on the top and bottom outer surfaces of one of the layers of the debonding structure, the first peeling surface corresponding to the top surface of the patterned layer, and the second peeling surface corresponding to the top surface of the rigid substrate.

In possible embodiments, the laminate structure may further comprise one or more additional layers extending between the at least one debonding layer and the flexible substrate device layer. These additional layer(s) have moisture barrier properties, having for example a water vapor transmission rate of 10-1 g/m2/day or lower.

In possible embodiments, the total thickness of the debonding structure is 20 µm or less.

According to another aspect, a method of manufacturing flexible microelectronics devices is provided. The method comprises forming a laminate structure as described above. The method may comprise providing the rigid substrate, forming the debonding structure over the rigid substrate; forming the flexible microelectronics structure over the debonding structure; and separating the flexible microelectronics structure from the rigid substrate at a peeling interface by applying a debonding force on the first and/or on the second peeling surfaces.

In possible implementations, the method further comprises transferring the flexible microelectronics structure onto a flexible host substrate.

Depending on the implementation, the peeling interface can be provided between the two of the debonding layers of the debonding structure; between debonding structure and the flexible microelectronics structure; or between the debonding structure and the rigid substrate.

In possible implementations, the separation can be achieved by applying the debonding force with one or more vacuum-enabled surfaces on the laminate structure, to separate the flexible microelectronics device from the rigid structure by delaminating the first peeling surface of the debonding structure from the second peeling surface on the rigid substrate. One possible option is to apply a controlled release of the pressurized fluid at an opened section of the laminate structure between the first and second peeling surfaces. In possible implementations, the separation comprises an initiation phase and a peeling phase, when the debonding force applied during the initiation phase being greater than during the peeling phase. One possible option is to inject a pressurized fluid between the first and second peeling surfaces using a laminar jet. Another option is to inject the pressurized fluid the first and second peeling surfaces using one or more distinct jets. Depending on the implementation, the separation is performed at a delamination speed of above 25 mm/s, and preferably above 35 mm/s, and more preferably above 100 mm/s.

In possible implementations, the separation is performed by injecting one or more concentrated jets, creating a fluid pocket or fluid accumulation build-up, that propagates from within a central region between the first and second peeling surfaces toward edges of the laminate structure. In possible implementations, a catalyst can be injected between the first and second peeling surfaces. The catalyst may include one of: a water-based fluid, acetone, isopropyl alcohol, methanol or fluorocarbon-based fluid. A jet may be projected through a longitudinal slit provided at a frontend of a fluid injection nozzle, creating an air knife when exiting the nozzle or one or more distinct jets can be projected through two or more outlets provided at a frontend of a fluid injection nozzle, the outlets being spaced apart by a predetermined distance.

In possible implementations, the flexible device structure can be affixed to the flexible host substrate, the flexible host substrate comprising a polymer, plastic or an organic or inorganic thin film.

In possible implementations, a laminate structure used in the manufacturing of electronic devices is provided. The laminate structure comprises a first rigid substrate; a second thin substrate, the second thin substrate being thinner than the rigid substrate; a debonding structure provided between the rigid substrate and the second thin substrate; the laminate structure comprising first and second peeling surfaces, at least one of the peeling surfaces corresponding to a surface of the debonding structure or to a surface within the debonding structure, the first and second peeling surfaces being peelable by a debonding force resulting from a mechanical delamination and/or from a pressurized fluid delamination, allowing separating the second thin substrate from the first rigid substrate.

Other features will be better understood upon reading of embodiments thereof with reference to the appended drawings.

BRIEF DESCRIPTION OF THE DRAWINGS

FIG. 2A is a flowchart of a method for manufacturing a flexible microelectronics device, in accordance with one embodiment, where a single layer debonding structure is used. FIGS. 2B and 2C are schematic representations of steps of the method of FIG. 2A.

FIGS. 6A to 6C are schematic representations of different laminate structure comprising a multilayer debonding structure, according to various embodiments.

FIG. 8A is a schematic representation of a mechanical delamination. 8B is a schematic representation of a pressurized fluid delamination.

FIG. 16 shows a flexible microelectronics structure on a rigid substrate, in accordance with one embodiment.

FIGS. 17A-B each illustrate an embodiment of the cutting mechanism. FIG. 17A shows a knife or a blade and FIG. 17B shows a laser.

FIG. 18 illustrates an example of a mechanism for initializing a peeling step, by creating an opened or exposed section at an edge of the laminate structure.

FIG. 19 shows that the peeling step initialized with the mechanism of FIG. 18 may be achieved with a vacuum stage, wherein a roller is present below the stage holding the rigid substrate to maintain an even peeling line.

DETAILED DESCRIPTION

Figure 1B:
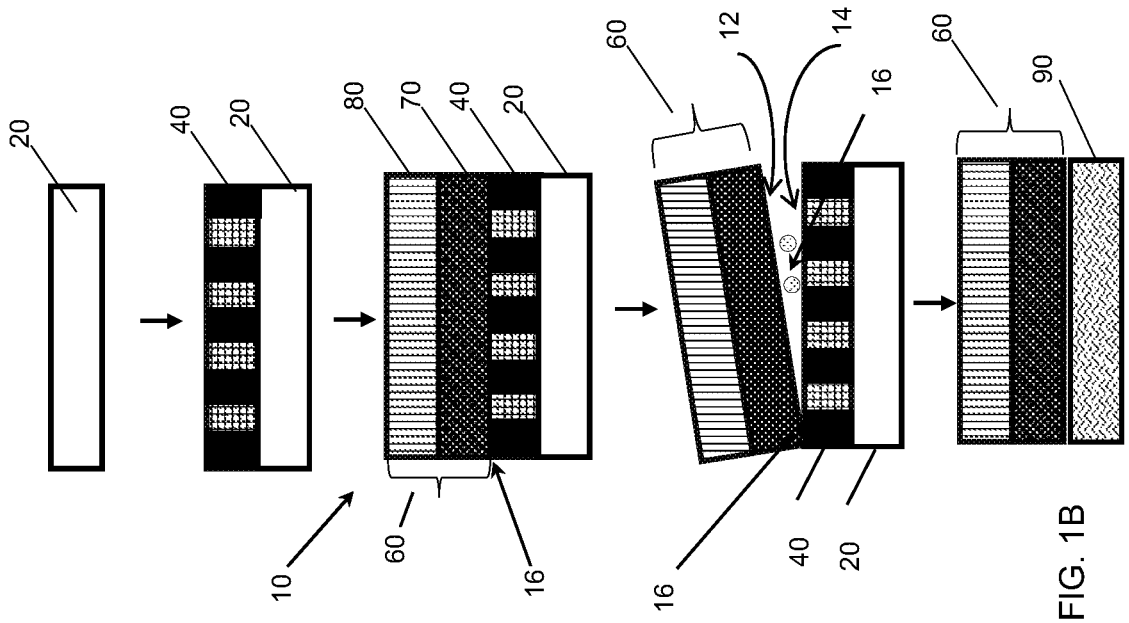
FIG. 1B is a schematic representation of steps of the method of FIG. 1A.

In the following description, similar features in the drawings have been given similar reference numerals. In order to not unduly encumber the figures, some elements may not be indicated on some figures if they were already mentioned in preceding figures. It should also be understood herein that the elements of the drawings are not necessarily drawn to scale, and that the emphasis is instead being placed upon clearly illustrating the elements and structures of the present embodiments.

The terms "a", "an" and "one" are defined herein to mean "at least one", that is, these terms do not exclude a plural number of items, unless stated otherwise. Terms such as "substantially", "generally" and "about", that modify a value, condition or characteristic of a feature of an exemplary embodiment, should be understood to mean that the value, condition or characteristic is defined within tolerances that are acceptable for the proper operation of this exemplary embodiment for its intended application.

Unless stated otherwise, the terms "connected" and "coupled", and derivatives and variants thereof, refer herein to any structural and/or functional connection or coupling, either direct or indirect, between two or more elements. For example, the connection or coupling between the elements may be mechanical, optical, electrical, logical, or any combination thereof.

The expression "device" refers to a component or an assembly associated with at least one functionality. Examples of devices are electronic devices, optoelectronic devices, magnetic devices, electrode arrays, passive structures, micro-electromechanical systems, or any combinations thereof.

The expression "flexible electronics", variants and derivatives thereof, are used to refer to a class of components, devices, circuits, assembly, and the like including deformable, conformable, and/or stretchable layers. The deformable, conformable, and/or stretchable layers could be a device layer, a substrate layer, or both. Such layers could be made from or include, for example and without being limitative, plastic, metal foil, paper, flex glass, or any other materials similar properties.

The term "alloy" refers to a material or a composition of materials including at least two different elements. For example, and without being limitative, an alloy could include two, three or four different elements. In the context of the current disclosure, the expression "metal alloy" refers to an alloy comprising at least one metal.

The term "p-type doping" refers to the incorporation of an impurity in the growing layer to create an excess of positive charges known as holes. The term "n-type doping" refers to the incorporation of an impurity in the growing layer to create an excess of negative charges known as electrons. The term "intrinsic doping (i)" refers to the case where a semiconductor layer has no excess negative or positive charges. The terms "p-n junction" or "n-p junction" refer to two successive layers, wherein one layer is p-type doped and the other one is n-type doped. The terms "p-i-n junction" or "n-i-p junction" refer to three successive layers, wherein one layer is p-type doped, one is intrinsic, and one is n-type doped.

The description generally relates to techniques, and more specifically to methods for the fabrication and release of a debonding structure provided between a flexible microelectronics structure (or film) and a rigid substrate (also referred to as a "rigid carrier"). The debonding structure may include a single debonding layer, two layers or several layers, as will be described in greater detail below. Similarly, the flexible microelectronics structure or film may include one or more device layer(s) and one or more device substrate layer(s). The debonding structure may facilitate the debonding of the flexible microelectronics structure from the rigid substrate which may be useful, for example and without being limitative, for transferring the flexible microelectronics structure onto a flexible host substrate. In nearly all implementations presented in the current disclosure, the delamination techniques presented herein do not require the application of heat to the substrates.

The technology and its advantages will become more apparent from the detailed description and examples that follow, which describe the various embodiments of the technology. More particularly, the following sections of the description will present a laminate structure comprising the debonding structure and a method for forming the same. The method for separating the flexible microelectronics structure from the rigid substrate will also be described, according to different implementations, in which catalysts may be used or not. A method of manufacturing flexible microelectronics devices will also be described.

With reference to FIGS. 1 to 22B, a method for manufacturing a flexible microelectronics device will be described, according to different possible embodiments. As it will be explained in greater detail below, this method includes fabricating a laminate structure that comprises a debonding structure, for facilitating the separation (or peeling) of the flexible microelectronics structure from the rigid substrate, and optionally transferring the flexible microelectronics structure onto a flexible host substrate to form a flexible microelectronics structure. The laminate structure can be manufactured according to different embodiments, and the separation (or delamination) process can also be performed according to different implementations.

Figure 1A:
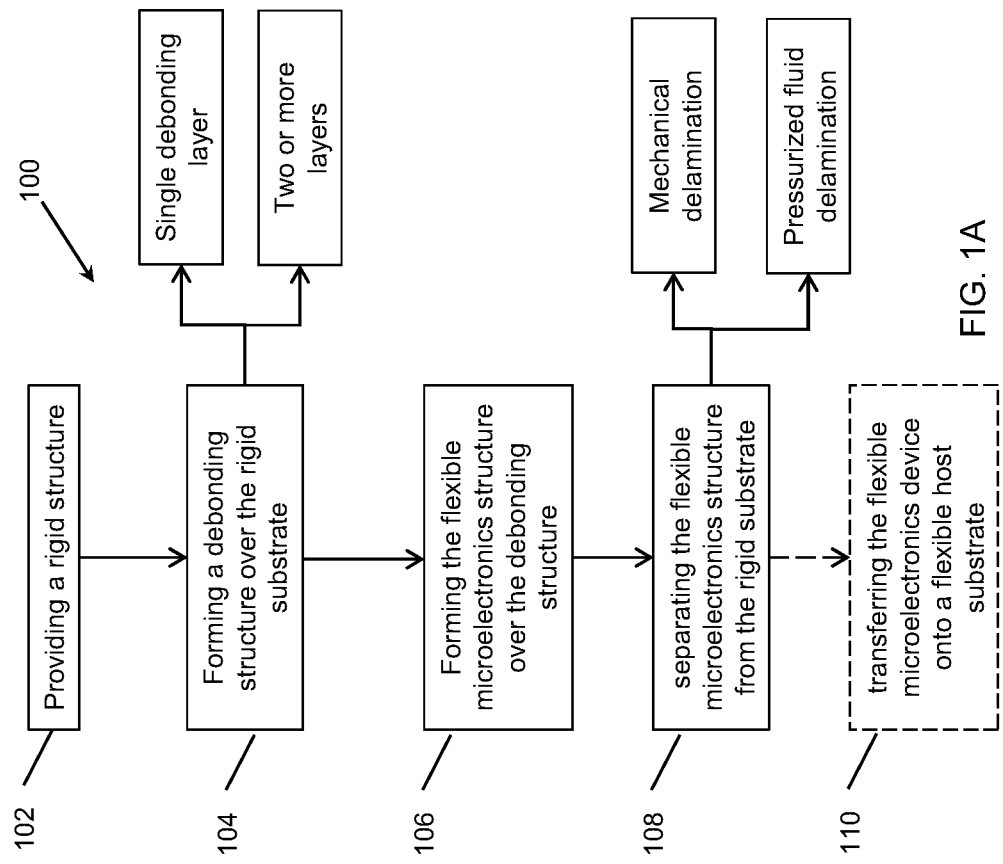
FIG. 1A is a flowchart of a method for manufacturing a flexible microelectronics device, in accordance with possible embodiments.
Figure 3F:
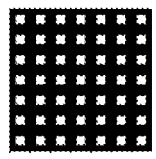
FIGS. 3A to 3J are schematic representations of possible patterns having different aspect ratios of a debonding layer, according to possible embodiments.
Figure 3G:
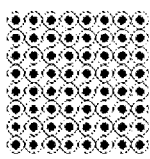
Figure 3H:
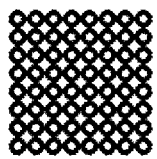
Figure 3I:
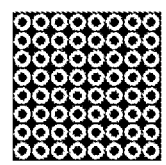
Figure 3J:
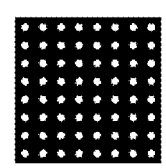
Figure 3A:
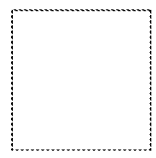
Figure 3B:
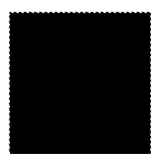
Figure 3C:
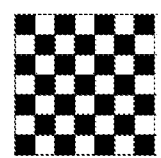
Figure 3D:
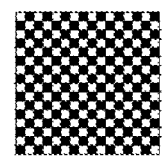
Figure 3E:
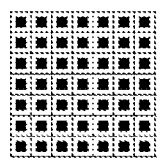
Figure 4:
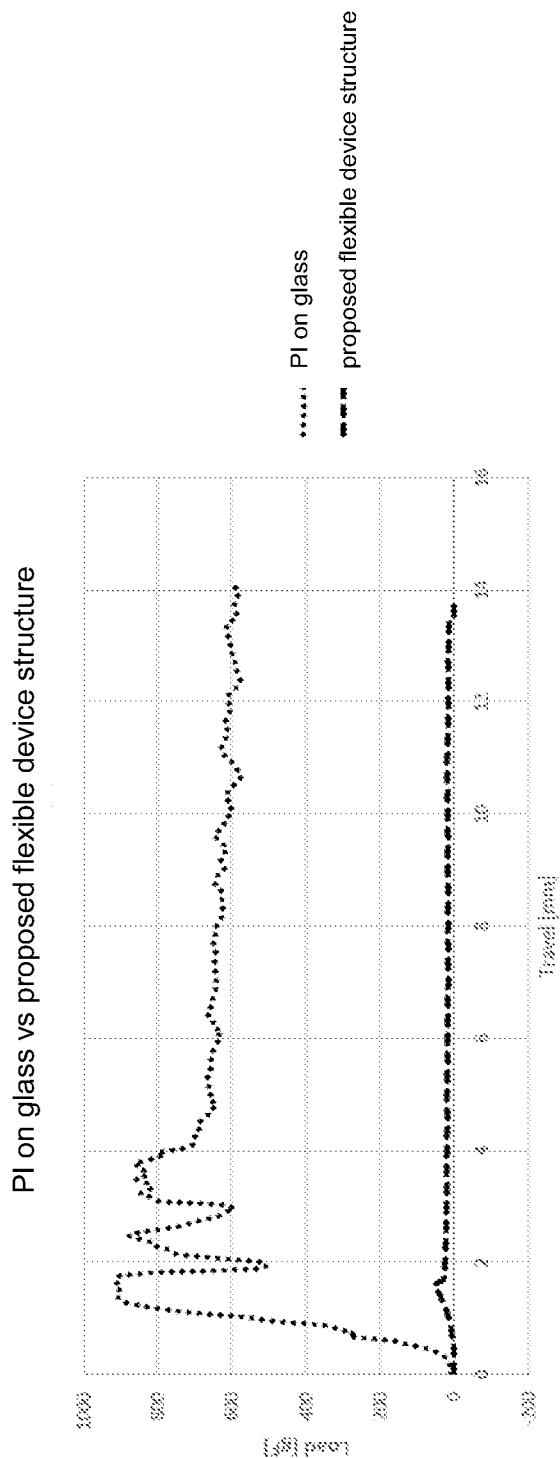
FIG. 4 is a graph representing the load (in gF) as a function of the delamination travel (in mm), required to delaminate a) polyimide from a glass substrate and b) the proposed debonding structure from a glass substrate.

Broadly described, and as illustrated in FIGS. 1A and 1B, the method 100 includes steps to form the laminate structure 10. The laminate structure 10 includes a rigid carrier, a debonding structure and a flexible microelectronics structure. The method 100 also includes steps to separate or peel the flexible microelectronics structure from the rigid substrate (or carrier), at a peeling interface of the debonding structure. Beginning with step 102, a rigid substrate 20 is provided. The rigid substrate (or rigid carrier) can be made of several materials, including silicon, alumina, steel, sapphire, and glass. Rigid substrate made of glass may comprise barium borosilicate, soda lime silicate or alkali silicate.

At step 104, the debonding structure 40 is formed over the rigid substrate 20. The debonding structure 40 can comprise one, two or a plurality of layers. In one embodiment, the debonding structure 40 comprises a single debonding layer, which is preferably made of oxide, nitride, carbide or oxynitride. Examples of such materials include silicon dioxide ($SiO_2$), silicon nitride (SiN), silicon carbide (SiC) and silicon oxynitride ($SiO_xN_y$). In other embodiments, the debonding structure 40 includes two layers, referred to as "debonding layers". For example, a first debonding layer can be formed on the rigid substrate 20, and a second debonding layer can be deposited on top of the first debonding layer, forming a two-layer debonding structure. Preferably, at least one of the first and second debonding layers is made of oxide, nitride, carbide or oxynitride. The other debonding layer is preferably made of a metal or of a metallic alloy. In yet other embodiments, the debonding structure can include additional layers, having specific properties, such as moisture barrier properties. In a possible implementation, the first layer extending over the rigid substrate is a non-metallic, inorganic layer, of less than 5 μm, and the second layer over the first layer is a metallic (metal or metal alloy) layer, having a thickness of less 0.1 μm or less.

At step 106, the flexible microelectronics structure 60 is formed over the debonding structure 40. The flexible microelectronics structure 60 can include at least one flexible substrate device layer 70 (i.e. one or more substrate layers) and at least one device layer 80 (i.e. one or more device layers). For example, the device layer can be a very thin wafer. Preferably, the flexible microelectronics structure 60 also include one or more encapsulating layers. The flexible substrate layer 70 and/or the device layer 80 can be made or include polyimide, polyamide, polyethylene terephthalate (PET), polydimethylsiloxane (PDMS), and/or thermoset plastic material. For example, and without being limitative, the flexible microelectronics structure 60 can be a stack of coextending layers. The flexible substrate layer 70 and the flexible device layer 80 can be formed in an alternated configuration (alternance of a flexible device substrate layer 70 and a flexible device layer 80) or in a successive configuration (a plurality of device substrate layers 70 onto which are provided a plurality of device layers 80), depending on the type of flexible microelectronics structures being manufactured. The device layer 80 may include one or more p-n junction(s), n-p junction(s), p-i-n junction(s) and/or n-i-p junction(s) to provide electronic functionalities The debonding structure 40 thus includes at least one layer made of a non-metallic and inorganic material. By non-metallic and inorganic material, it is meant that this layer does not include any metal or metal alloy and does not include any carbon. The advantage of using such a material is that delamination is easier than when only a metallic layer is used at the debonding interface. The average debonding pressure required, for both mechanical delamination and pressurized fluid delamination, is less when at least one of the debonding interfaces is a non-metallic and inorganic material, compared to when a metal layer is used, as will be explained in greater detail below. In possible implementations, the debonding structure may comprises more than one peeling interfaces.

As illustrated in FIG. 1B, the laminate structure 10 comprises first and second peeling surfaces 12, 14, where at least one is provided on an outer surface of the debonding structure 40. Before delamination, the first and second peeling surfaces 12, 14 join at a common peeling interface 16. In the example of FIG. 1A, the first debonding surface 14 corresponds to the top surface of the debonding structure 40, while the second debonding surface 12 corresponds to the bottom surface of the flexible microelectronics structure 60. In alternate embodiments, where the debonding structure comprises more than one debonding layer, the first and second surfaces can correspond to top and bottom surfaces of interfacing debonding layers. In other words, the delamination can occur between two adjacent layers of the debonding structure 40. In yet other implementations, the first debonding surface can correspond to the top surface of the rigid substrate, and the second debonding surface can correspond to the bottom surface of the debonding structure 40. When forming the debonding layers, the process can be adapted so as to modify internal tensile and/or compression stresses within the layers, to as to control where the delimitation will occur in the debonding stack.

Still referring to FIGS. 1A and 1B, at step 108, the first and second peeling surfaces are separated by applying a debonding force resulting from a mechanical delamination and/or from a pressurized fluid delamination, allowing peeling the flexible microelectronics structure from the rigid substrate. The separation step can be performed via mechanical delamination (e.g., using vacuum-enabled surfaces), or via pressurized fluid delamination (e.g., using the controlled release of gas jets). The separation step is also typically performed in two phases or sub steps: first, with an initiation phase and then with a delamination (or peeling) phase, as will be explained in more detail below. During the separation step, a catalyst 16 can be injected between the first and second peeling surfaces, to further facilitate or speed up the delamination process. The catalyst can include one of: a water-based fluid, acetone, isopropyl alcohol, methanol or a fluorocarbon-based fluid.

Still referring to FIGS. 1A and 1B, the method may include a step 110 of transferring the flexible microelectronics structure onto a flexible host substrate, to form a flexible microelectronics assembly. This step is optional since depending on the debonding structure, and depending on where the delamination occurs (i.e. at which of the different layer interfaces), the flexible microelectronics structure, once separated from the rigid carrier, may be complete. If protecting and/or encapsulating layers are provided underneath the flexible microelectronics structure after the delamination process, there may be no need to transfer the device onto another flexible host substrate.

Single Debonding Layer Structure

With reference to FIGS. 2A, 2B and 2C, the method for manufacturing a flexible microelectronics device will be described, according to one possible implementation. This implementation includes forming a single debonding layer as the debonding structure, this single layer being made of oxide, nitride, carbide and oxynitride. Optionally, this single debonding layer can be patterned to further facilitate peeling of the flexible microelectronics structure therefrom.

In this example, step 104 consists of forming the debonding layer (for example, a silicon dioxide ($SiO_2$) layer) on a rigid substrate (such as a glass wafer). In step 106, the flexible microelectronics structure (indicated as "flexible device structure") is formed on the single debonding layer, in this case the silicon dioxide layer 42. As previously mentioned, the flexible device structure 60 includes at least one device substrate layer and at least one device layer on the device substrate layer. Once the flexible microelectronic device 60 is formed on the rigid substrate, over the debonding layer 42, step 108 is carried out, i.e., the flexible microelectronics structure is peeled from the rigid substrate. The flexible microelectronics structure 60 can then be transferred onto a flexible host substrate if needed.

An example of the laminate structure resulting from this embodiment is shown in FIGS. 2B and 2C. As illustrated, the debonding structure corresponds to a single oxide layer 42, and the first and second peeling surfaces 12, 14 can correspond to the bottom surface of the flexible device substrate layer and to the top surface of the debonding layer (FIG. 2B). Alternatively, the first and second peeling surfaces can correspond to the bottom surface of the debonding layer and to the top surface of the rigid carrier (FIG. 2C).

Preferably, the debonding layer 42 has a thickness of about 10 µm or less. It is also possible to form the debonding layer with patterns, to facilitate peeling and/or to "force" the peeling to occur at the patterned surface. In one possible implementation, forming a patterned layer may include first forming a silicon dioxide layer on the rigid substrate 20, and then patterning the silicon dioxide layer to form patterns therein. Forming the silicon dioxide layer 42 may be carried out by a vapor deposition process, for example by sputtering, or by chemical vapor deposition. Patterning the silicon dioxide layer may be achieved using conventional and/or standard photolithography process(es).

Examples of possible patterns are illustrated in FIGS. 3A to 3J, wherein the clear areas represent the rigid substrate 20

(or portion(s) thereof) and the dark areas represent the oxide layer (such as SiO2.) As illustrated, the patterns may be evenly distributed on the top surface of the rigid substrate 20, i.e., each pattern may be spaced apart one from another by a substantially constant distance or dimension. In the depicted embodiments, each pattern is square or round, but the patterns may have any other shapes. Varying the area ratio of the patterns with respect to the total area of the rigid substrate 20 allows varying or controlling the debonding force needed to separate the flexible microelectronics structure 60 from the rigid substrate 20. For example, if the debonding force associated with the first limiting case is F1 and the peeling force associated with the second limiting case is F2, the peeling force associated with a given ratio, ranging from 0% to 100% exclusive, will be comprised between F1 and F2. In the examples illustrated in FIGS. 3C to 3J, different patterns are illustrated. Each pattern illustrated in FIGS. 3A to 3J is associated with a patterned area ratio (0%, 100%, ~50%, ~50%, 25%, 75, 19.6%, 58.9%, 41.1% and 80.37%) and a debonding (or peel) force (F1 to F10). In some embodiments, $F2<\{F3, F4, \ldots, F9, F10\}<F1$.

Referring again to FIGS. 2B and 2C, the method may further include an optional step 105 of forming one or more additional layers (not illustrated) between the debonding layer 42 and the flexible microelectronics structure 60. In some embodiments, one or more of the additional layers may have moisture barrier properties. For example, one or more of said additional layers (which may also be referred to as "barrier" layers") may have water vapor transmission properties of about 10-1 g/m2/day or less. The step of forming the barrier structure may be carried out with a vapor deposition method. The one or more additional layers can be made of silicon nitride, aluminum oxide or polyimide, as examples only.

During the peeling step 108, the method may include introducing a catalyst between the rigid substrate 20 and the flexible device substrate layer, while peeling the flexible device structure 60 from the rigid substrate 20. in the example illustrated, the catalyst 24 can be introduced at the interface between the structured silicon dioxide layer 42 and either one of the bottom surface of the flexible device structure 60 or the top surface of the rigid carrier 20. After the flexible microelectronics structure 60 has been peeled from the rigid substrate 20, it can be transferred and affixed onto a flexible host substrate (not shown).

The delamination mechanism for a single debonding layer structure is controlled by the surface properties at the peeling interface, as schematically represented by FIGS. 2B and 2C. The weak, debonding interface can be located directly beneath the flexible device substrate (FIG. 2B) or between the rigid substrate and the debonding layer (FIG. 2C). The smooth, crystalline, and chemically inert surface of a debonding layer will provide no chemical bonding and creates a weak interface, for example, between the flexible device substrate layer and the debonding layer interface. In this case, the bonds are physical, electrostatic in nature and can easily be broken using a sufficient force or a polar catalyst. On the contrary, if a surface provides chemical bonding, for example, a flexible device substrate layer on top of an organic substrate, the force required to separate the film is much greater and can lead to tearing of the film and other defects. Glass rigid substrate surface can be rich in hydrogen, which enhances the bonding to organic layers. Therefore, a flexible device structure deposited directly on glass results in a strong adhesion, most specifically at the interface with the flexible device substrate layer, as illustrated by the graph at FIG. 4, where the adhesion of polyimide (PI) (typically used as the flexible device substrate) on a glass substrate is compared to the adhesion of a debonding layer as proposed in the present description. The preferred method for delamination in this situation is laser lift-off (LLO), which is an energy intensive, low yielding, thermally ablative process. Low hydrogen-concentration SiO2 vacuum-processed crystalline layer offers an easier way of debonding a flexible, organic layer, i.e., the flexible device substrate layer and by extension the whole flexible device structure. In combination with pressurized fluid delamination process, it presents a cheaper and potentially higher yielding alternative to LLO.

The same principle can be applied for other vacuum processed layers such as oxides, nitrides, and carbides, if the interface provided by these films is chemically inert to the flexible substrate polymer. The bonding force between a polymer film and an inert interface can be 30 times lower than the bonding force between the polymer and a chemically bonded interface. In the case of delamination at the flexible substrate interface, the bonds between the debonding layer and the flexible substrate are much weaker than the bonds between the debonding layer and rigid carrier (FIG. 2B). For the delamination at the rigid carrier interface, the bonds between the debonding layer and rigid carriers are much weaker than the bonds between the debonding layer and the flexible substrate (FIG. 2C.)

Two Debonding Layer Structure

Figure 5A:
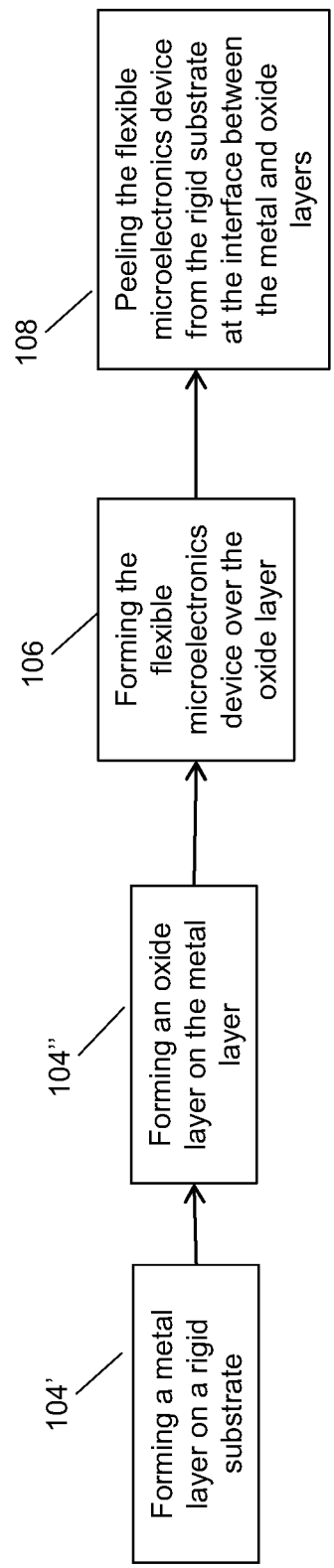
FIG. 5A is a flowchart of a method for manufacturing a flexible microelectronics device, in accordance with another possible embodiment where a two-layer debonding structure is used.
Figure 5B:
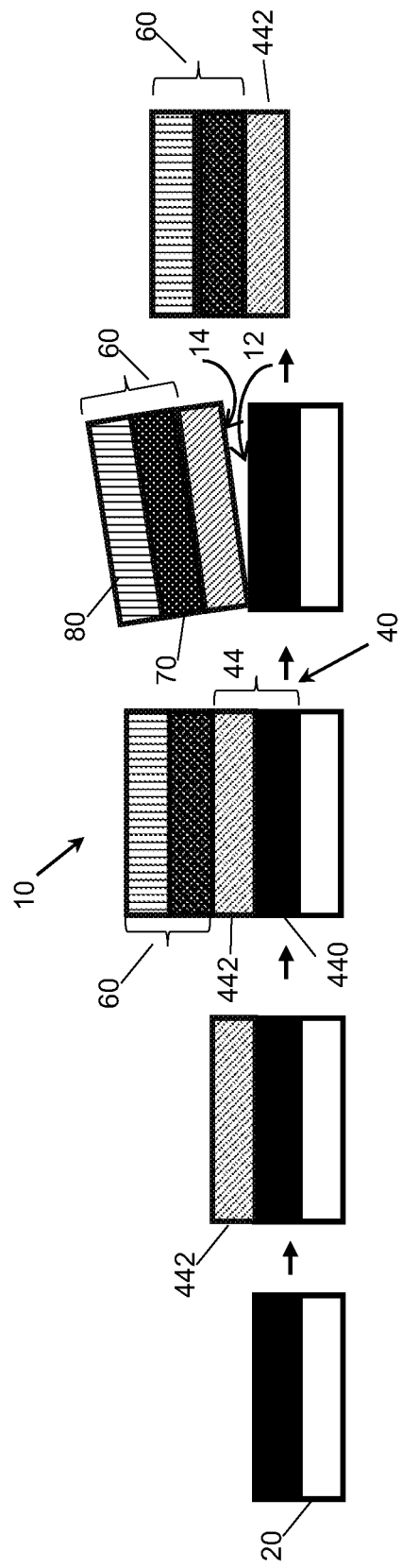
FIG. 5B is a schematic representation of steps of the method of FIG. 5A.

Referring now to FIGS. 5A and 5B, the debonding structure 40 may include two layers: a first debonding layer 440 comprising a metal or a metallic alloy; and a second debonding layer 442 comprising one of: an oxide, a nitride, a carbide and an oxynitride. According to this embodiment, the method includes a step 104' of forming a metallic layer between the rigid substrate 20 and the oxide layer 440 (which can be patterned or not), by depositing a layer made of metal on the rigid substrate. In the context of the current description, the expression "metallic" encompasses metals, metalloids, and metal alloys. The term "metal" typically refers to a chemical element, composition, or material being electrically conductive. The term "metalloid" typically refers to a metal-like chemical element, composition, or material i.e., a substance having properties in between or that are a mixture of metal(s) and nonmetal(s). The metal can be, for example, and without being limitative, Ni, Al, Cu or Pd. Alternatively, layer 440 can be made of a metal alloy, i.e., a substance including at least one metal and at least another non-metal material. In FIG. 5B, the metallic layer 440 provided on the rigid substrate can either be made from metal(s) or metal alloy(s). It would be noted that, in some embodiments, the metallic layer 440 is made from a material having a percentage of elongation at break point of 8%. In the context of the current description, the expression "percentage of elongation at break" refers to the ratio between an increased length and an initial length of the material after breakage, for a given temperature. This property of a material is generally associated with the ability of the material to resist changes of shape without formation of cracks. In some embodiments, the metallic layer 440 has a thickness of 5 μm or less. The step of forming the metallic layer may be carried out by a physical vapor deposition process, such as, for example and without being limitative, sputtering, electron beam evaporation, or thermal evaporation or by electrochemical process, such as electroplating", for thicker metal film.

The step of forming the metallic layer 440 on the rigid substrate 20 is followed by forming an oxide layer (or nitride, carbide or oxynitride), for example SiO2, on the metallic layer (step 104"). The method also includes a step 106 of forming the flexible microelectronics device 60 on the silicon dioxide layer 442. The flexible microelectronics structure (which may, in some embodiments, be referred to as a flexible microelectronics film) includes a device substrate layer 70 and a device layer 80, formed on the device substrate layer. Once the flexible microelectronics structure 60 is formed, a step 108 of peeling the flexible microelectronics structure from the rigid substrate is carried out. The flexible microelectronics structure may be then transferred onto a flexible host substrate. Step 104' may be carried out by a physical vapor deposition process. Nonlimitative examples of physical vapor deposition processes include, but are not limited to sputtering, electron beam evaporation, or thermal evaporation. Nonlimitative examples of physical deposition processes include but are not limited to electroforming. Layer 442 may be deposited using any techniques already known in the art, with a thickness of 15 μm or less. In some embodiments, alumina oxide (Al2O3 or "alumina"), may be used instead of SiO2. It will be noted that other metal oxide(s) or oxide(s) may alternatively be used. Optionally, the 2-debonding layer laminate structure can include one or more additional barrier layers (not illustrated) between the silicon dioxide layer 442 and the flexible microelectronics structure 60, such as moisture barrier layer(s).

Still referring to FIGS. 5A and 5B, in this exemplary embodiment, peeling the flexible microelectronics structure 60 from the rigid substrate 20 occurs between layers 440 and 442, such that the first and second debonding peeling surfaces are within the two-layer debonding structure 44, i.e., the peeling interface is within the debonding structure. In the depicted embodiment, the metallic layer 440 remains attached to the rigid substrate 20, and the non-metallic, inorganic layer 442 remains attached to the flexible device structure 60. In possible embodiments, transferring the flexible microelectronics structure 60 to another flexible host substrate may not be necessary.

Higher peeling rates can result in stronger debonding forces applied. When a high-peeling rate is contemplated, it may be useful to introduce or inject a catalyst between the two peeling surfaces of the debonding structure. The application or introduction of a gaseous catalyst may remove or mitigate challenges associated with working with liquids during the manufacturing of the flexible microelectronics devices, which may be useful in the context wherein electronic, organic and/or optoelectronic materials that may be affected or degrade in the presence of liquids. In other embodiments, the catalyst may be a liquid. The liquid may be selected from the following nonlimitative list of examples: a water-based fluid, acetone, isopropyl alcohol, methanol and fluorocarbon-based fluid.

Multilayer Debonding Structure

Figure 6D:
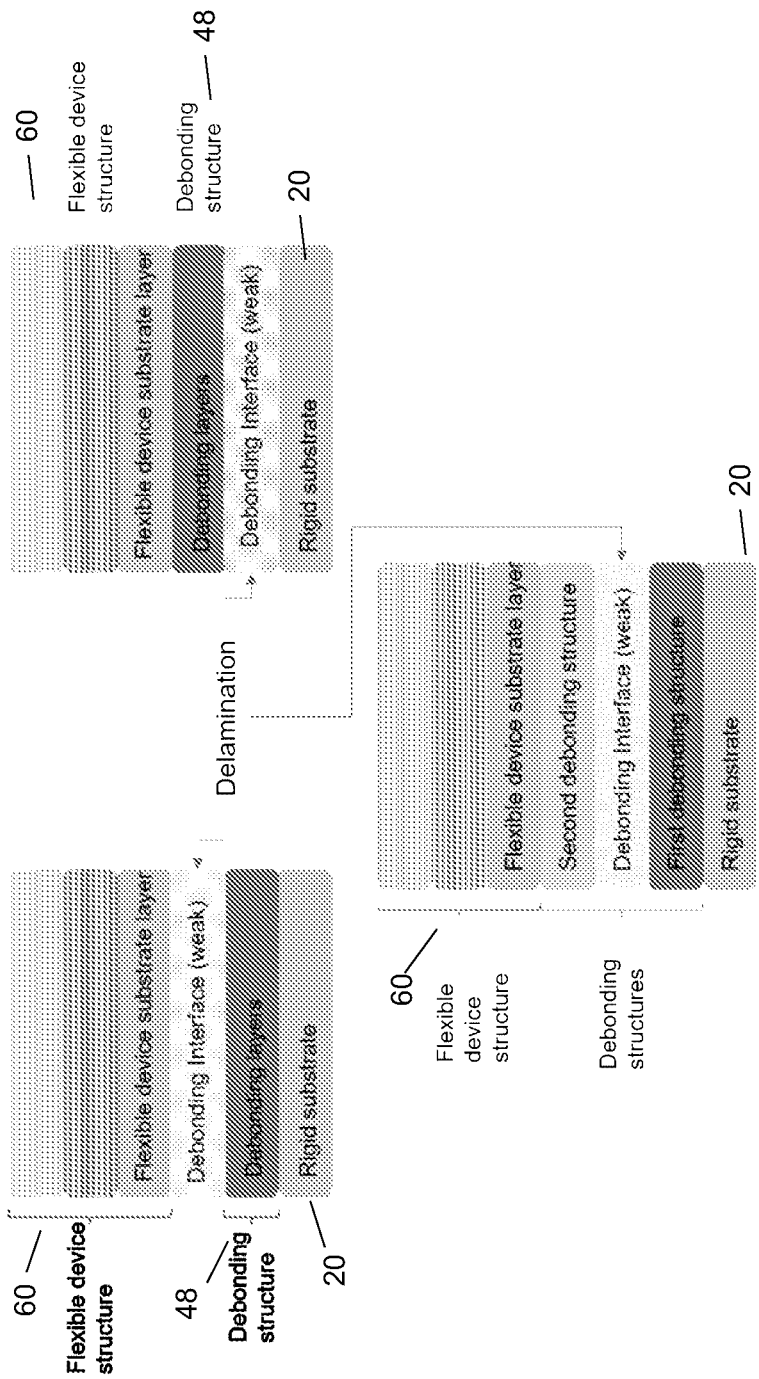
FIG. 6D is a schematic representation of possible multilayer debonding structures, where the delamination occurs at different debonding interfaces.

Referring now to FIGS. 6A to 6D, a multilayer debonding structure 48 may also be manufactured, according to a possible implementation. This configuration offers complete control on the delamination interface location, such as, in addition to the single layer embodiment described above, both the rigid substrate and the flexible device structure can be in contact with one or more debonding layers, as best shown in FIG. 6D.

According to these embodiments, the polymer-based flexible substrate carrier 60 does not necessarily delaminate from its immediate interface. Instead, sublayers are included inside the laminate structure 10, 10' or 10" in a way that they will delaminate from the rigid carrier 20 and stick to the flexible substrate layer (typically a polymer film). Instead of delaminating at the bottom surface of the flexible substrate 60, the laminate structure can be designed so the debonding layer itself delaminates from the rigid carrier (typically glass) with the flexible substrate 60 still adhering. Doing so, a multiple layer stack 10 can be designed that can lift with the debonding layer while still carrying the flexible substrate 60. Using the thicknesses of the layers inside the debonding structure as control, multilayer stacks that lift the flexible device substrate layer completely off of the debonding structure are also possible.

It will be noted that the multilayer debonding structure may comprise one or more patterned layers, as described in the section relating to the "single layer debonding structure. Stress-Assisted Debonding Still referring to FIGS. 6A to 6C, and also to FIGS. 7A and 7B, in the case where one or multiple layers are delaminated with the flexible substrate 60, the internal stress inside the debonding layers can facilitate the debonding process. In possible implementations, the internal stress of one or more layers can be adjusted or modified to as to control where in the laminate stack (i.e., between which layer interfaces) the delimitation will occur. It has been observed that for some implementations, a debonding structure with a high compressive stress will tend to remain on the rigid carrier 20 while a layer (or film) with a high tensile stress tends to delaminate from the rigid carrier 20.

Therefore, a multilayered debonding structure or stack 48 with sufficiently high tensile stress can be delaminated more easily when a debonding force is applied at the rigid carrier interface, as illustrated in FIG. 6A. The same can be applied in the case of a single debonding layer, illustrated in FIG. 2C. The selection of the material inside the debonding structure can be extended to other metallic films, metallic alloys, oxide, nitrides, and carbides. If the stress within the multilayered stack is tensile, the flexible carrier 60 can be delaminated from the rigid carrier. By controlling the stress in layers beneath the flexible device substrate layer, delamination can be achieved in a scenario where a single debonding layer made of an oxide layer is not sufficient. Controlling the stress in layers can be extended to multiple layers beneath the flexible device substrate layer.

Figure 7B:
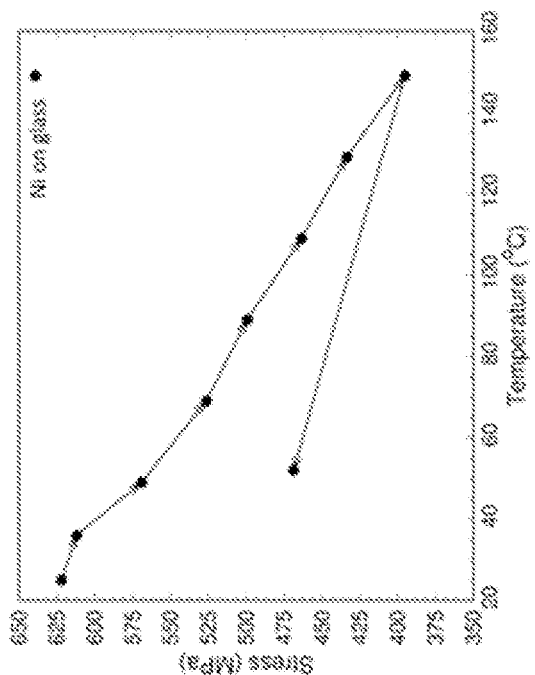
FIG. 7B shows a possible method of adjusting stress within a layer to control where the delamination can occur in a debonding structure.
Figure 7A:
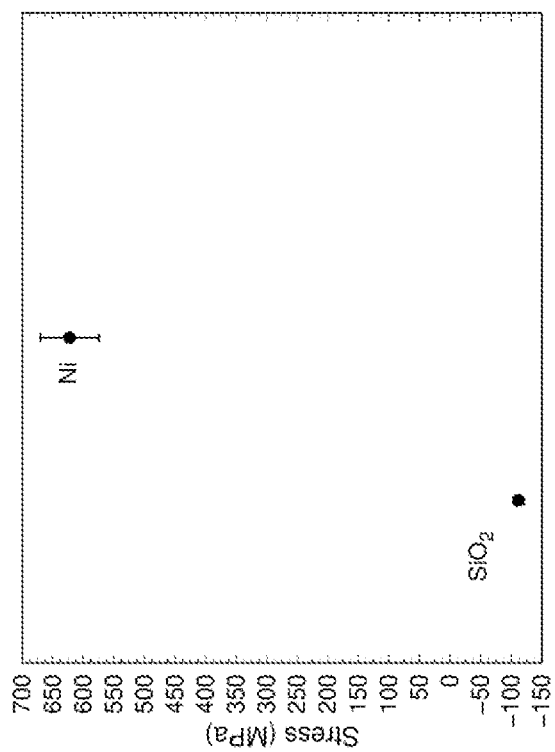
FIG. 7A is a graph of the stress levels inside debonding layers made of different materials.

In possible implementations, stress levels within or between layers can be controlled by post-treatment of the layers/films. FIG. 7B shows a graph illustrating how the stress can be controlled or adjusted as a function of heating or cooling of the film. Control on the stress management for the debonding mechanism can thus be performed, according to possible implementations.

Delamination

The following paragraphs will describe in more detail the different options that can be considered to separate the flexible microelectronics structure 60 from the rigid substrate 20.

Mechanical Delamination

Referring to FIG. 8A, mechanical delamination refers to the use of a mechanical force to peel off the flexible microelectronics structure 60 (typically a thin film stack) from the rigid carrier 20. In this example, the peeling interface is provided between the debonding structure 40 and the flexible microelectronics structure 60. As presented on FIG. 8A, the peeling force (FP) is applied along the flexible microelectronics structure stack (or film), at a certain angle (OP) with the rigid substrate 20, and the film is completely detached from the substrate at the separation point. The angle (OP) can be for example anywhere between near 0° and 90°. For example, when a roller is used, the angle (OP) can be very small, such as less than 5°. The process parameters that can be tuned according to this delamination method are the speed of the delamination (peeling rate) and the peeling angle. Different mechanical delamination techniques will be explained in more detail below.

While effective, mechanical delamination may not always be appropriate, since with possible embodiments of the laminate structure, the debonding force (or peeling force) may possibly stretch the flexible microelectronics film 60. Therefore, pressurized fluid delamination may be preferred, depending on the applications, as this method involves applying the force at the peeling interface only.

Pressurized Fluid Delamination

Figure 9:
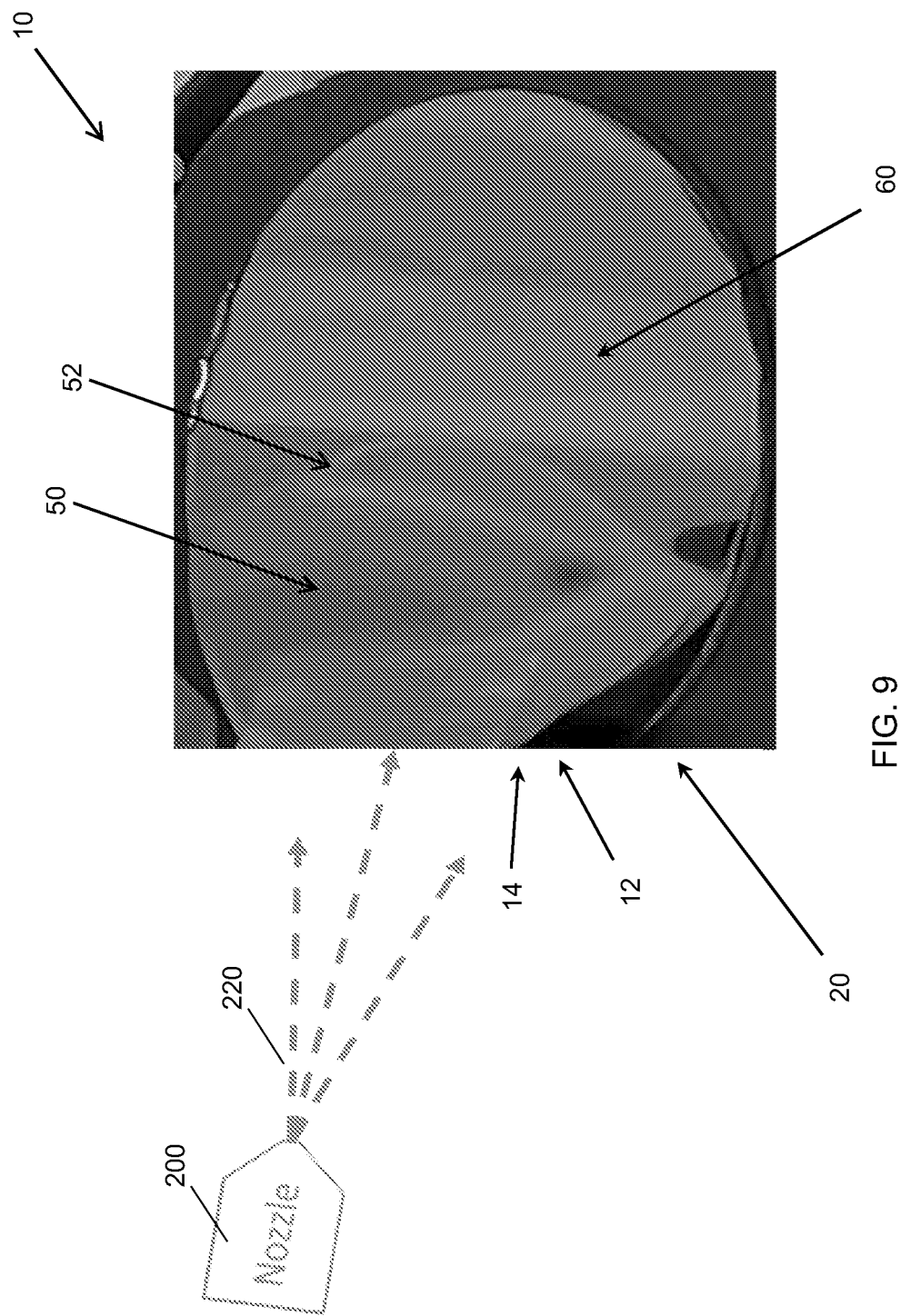
FIG. 9 is a schematic representation of the pressurized fluid delamination process, where a fluid accumulation is formed between the flexible microelectronics structure and the rigid substrate.

Referring to FIG. 8B, delamination using a pressurized fluid, projected in air jets, is schematically represented. In this process, a pressurized fluid is used to exercise a pressure beneath the flexible device structure 60 (or film stack), and directed toward the peel interface, to peel it off. In this method, a nozzle 200 can be used and placed at a distance from the separation point (DF) and inclined at a certain angle with the rigid substrate (OF). The nozzle ejects a direct flow of fluid (FF) in between the thin film stack 60 and the rigid substrate 20, which exercise a debonding force (or peeling force) FP at the interface between the two peeling surfaces. Some of the fluid bounces on the rigid substrate 20 and flexible film 60 surfaces (FF2), which contributes to the total debonding force FP. Both direct and secondary flow of fluid creates a fluid accumulation or pocket 50 that exercise a pressure on the film, as shown in FIG. 9, at an θP proportional to θF and with its peak intensity close to the separation point. Separating of the flexible microelectronics structure 60 from the rigid substrate 20 can be performed by injecting one or more concentrated air jets, creating an air pocket or bubble 50 propagated from within a central region of the laminate structure between the first and second peeling surfaces, toward edges of the laminate structure. Different nozzle configurations can be used to inject the pressurized fluid (typically air, but other gases can be considered). One or more distinct/separate air fluid jets can be injected, or alternatively, a laminar jet can also be used. Additionally, the pressurized fluid jet may be pulsed, alone or acting in conjunction with the nozzle incline angle, to achieve greater control of the both the magnitude and direction of the force delivered to the delamination interface for debonding.

Referring to FIG. 10A, the pressure of the fluid, the dimensions of the nozzle, the dimensions of the outlets, the distance between the outlets, the angle of the nozzle relative to the rigid substrate 20 and the outlet's distance from the separation point are all parameters that can be adjusted and tuned, to control the delamination process performed with this method. Considering that the flexible microelectronics structure 60 (or "thin film stack") can be sensitive to elongation and bending, the debonding force FP and the debonding angle θP can be adjusted to avoid damaging the device layer. With fluid delamination, the stretch of the film 60 is limited, because of the way the debonding force FP is applied. Moreover, the angle θF and distance DF can be adjusted to optimize the fluid pocket pressure, which produce higher peeling rate than the mechanical delamination.

Figure 10:
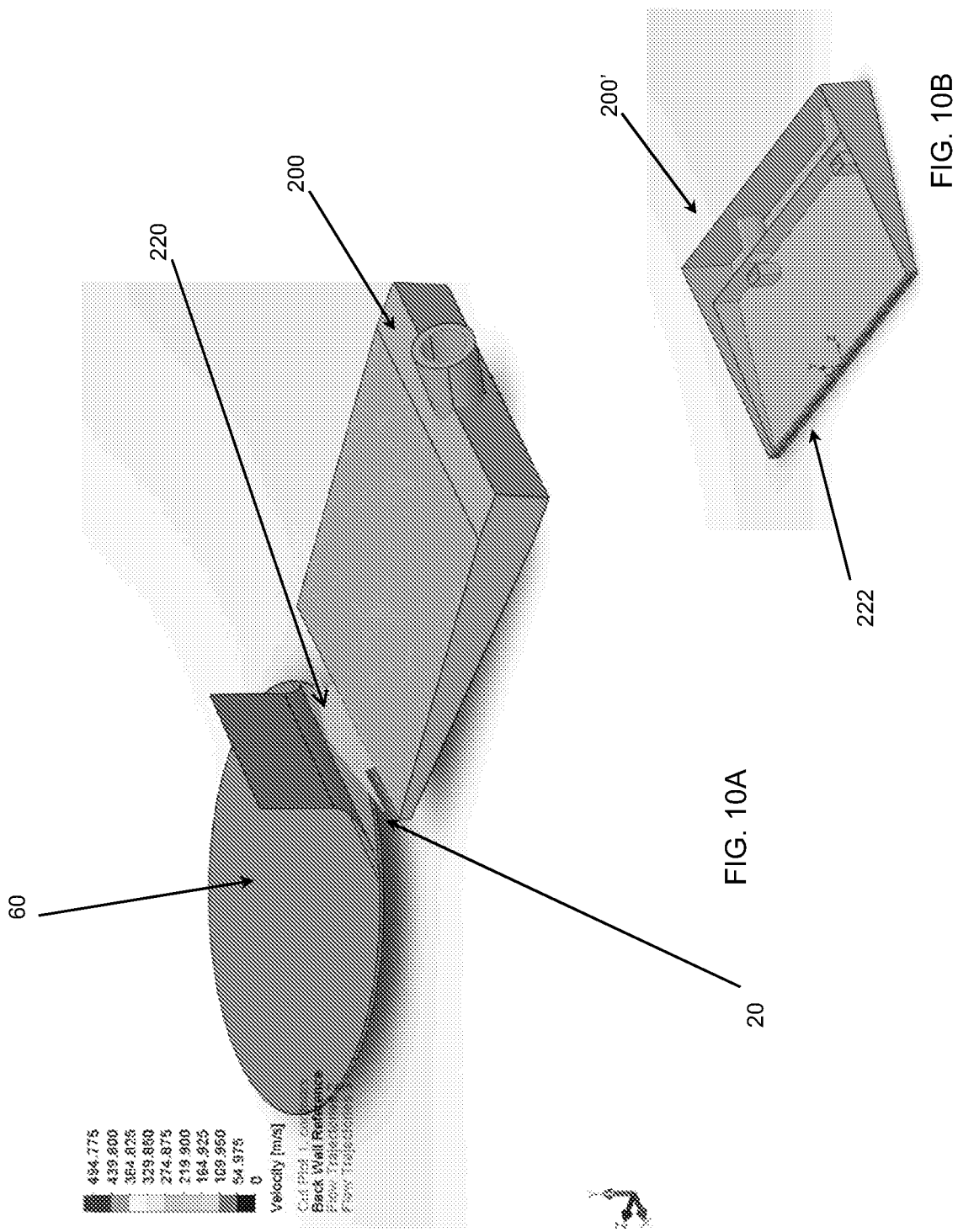
FIG. 10A is a schematic representation of a laminate structure used in the manufacturing of flexible microelectronics devices, while being delaminated using jets projected between peeling interfaces of the laminate structure by a nozzle having multiple outlets.
FIG. 10B shows a nozzle with a slit for projecting a laminar jet between the peeling surfaces, according to another implementation.

For the controlled release of the pressurized fluid, different nozzle configurations can be used. According to a possible implementation, as illustrated in FIG. 10B, a nozzle 200' with a continuous, longitudinal slit 222 oriented parallel to the rigid substrate can be used, to create a laminar jet between the peeling interfaces. The slit is provided at a frontend of the nozzle 200', which has a tapered body, narrowing from the backend of the nozzle towards its frontend. The pressurized fluid can thus create an air knife when exiting from the nozzle. According to yet another possible implementation, as illustrated in FIG. 10A, a nozzle 200 with multiple outlets 220 can be provided at the tapered, frontend of the nozzle, the nozzle comprising fluid channels extending therethrough and oriented substantially parallel to the rigid carrier, when delaminating. The pressurized fluid is injected between the first and second interfaces using distinct jets, such as air jets, projected substantially along the plane of the rigid carrier. Different fluids can be used, such as air jets. As explained previously, a small section at an edge of the laminate structure can first be opened, to facilitate penetration of the pressurized fluid between the peeling interfaces. The number and distance between fluid outlets can be selected based on the debonding force required to delaminate the laminate structure. In the illustrated embodiment, the fluid outlets are spaced apart by about 12 mm along the tapered front edge of the nozzle, but other configurations are possible. FIG. 10 shows a computational fluid dynamics simulation with such a nozzle configuration. As a result of the nozzle design, the velocity of the exiting pressurized fluid can be adjusted according to the delamination need. Closer nozzle outlets may allow more force from the pressurized fluid, and thus the impact on the flexible microelectronics structure (or film) can be generated in a more concentrated manner. As best shown in FIGS. 8B and 9, local air pressure beneath the film raises, and depending on the size and characteristics of the film 60, a moving bubble or pocket 50 is formed whose leading edge 52 constitutes the peeling interface. The bubble or pocket corresponds to excess fluid build-up between the two peeling surfaces. The peeling interface advances ahead of the bubble along the surface of the debonding structure until is completely separated from the interface. Depending on the implementation, such as when pressurized fluid is used, it may not be necessary to create an opened section in the laminate structure, the pressurized fluid, when injected with the appropriate pressure, may be sufficient to separate the first and second peeling surfaces to initialize the delamination process.

In general, the force required to perform the delamination should be strong enough to survive the device fabrication process but weak enough for the delamination to be performed with the pressurized fluid jet. The presence of the proposed debonding structure enables this. The proposed structure may also advantageously act as a getter, enabling diffusing contaminants and ions to be kept away from sensitive components in the flexible device structure. The proposed structure also requires no toxic solvents during its manufacture or in regular use.

Initiation Phase, Delamination/Peeling Phase and Delamination Speed

Figure 11:
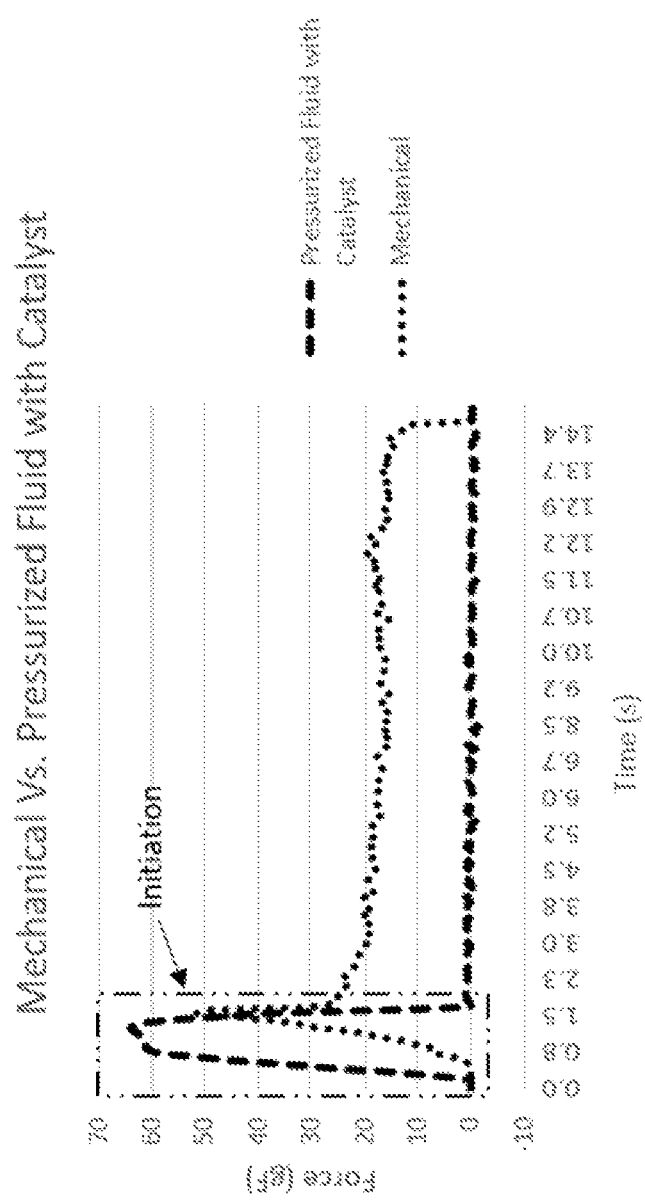
FIG. 11 is a graph showing the initiation and delamination forces involved in mechanical vs pressurized fluid delamination, as a function of time.

Referring now to FIG. 11, for both processes (mechanical and pressurized fluid delamination), the separating comprises an initiation phase and a peeling phase. To begin the delamination process, the peeling interface, irrespective of location, needs to be opened. This opening is known as initiation. During initiation, the static adhesive forces that hold the flexible microelectronics structure (or film) in place at the edge of the adhered region must be overcome.

In possible implementations, initiation may be performed with a mechanism that removes part of the flexible device structure (and debonding structure where applicable) at the periphery of the adhered region. This mechanism may constitute a cutting mechanism, including but not limited to physical or thermal, but may also be the pressurized fluid itself of an appropriate pressure.

As a result of the initial static forces to be overcome, a larger force is required to achieve initiation than is required to continue with the delamination once it has started, as shown in FIG. 11.

The debonding force applied during the initiation phase is greater than during the peeling phase. The graph of FIG. 11 shows the force sensed by a sensor attached to the flexible microelectronics film 60 during the separating process, for a mechanical delamination and a pressurized fluid delamination. The graph shows that the initiation force required for a mechanical delamination is slightly greater than for the pressurized fluid delamination, and thus the choice of the delamination process can be selected depending on the capacity of the flexible device film 60 to withstand the initiation force. The graph also shows that while both methods have comparable initiation peaks, the peeling force required for the remaining delamination phase is significantly less with pressurized air, compared to when a vacuum roller/stage are used (i.e., mechanical process). As shown in the graph, the force experienced by the flexible device substrate required to separate the flexible microelectronics film from the rigid carrier, using the proposed laminate structure with at least one debonding layer made of a non-metallic, inorganic material, is greater than 40 gF during the initiation phase, but less than 30 gF during the peeling phase. This force does not only get expended on the debonding, but some of it is also spent on lifting the film to maintain the fluid-filled pocket and in some cases some of this force might stretch the flexible microelectronics film. In possible implementations, the force applied during initialisation is equal or greater than 10 gF, and less than 4 gF during the delamination phase. In possible implementations, the debonding force during the initiation phase is greater than 30 gF and less than 25 gF during the peeling phase.

Another advantage of the pressurized fluid delamination process over the mechanical process is the time required to achieve delamination, for a given length of laminate sample. Experiments have shown that the average delamination speed of the pressurized delamination method is much greater than for a mechanical process. The pressurized fluid delamination time can be about 0.75 second for a length of 1 inch (inches or 101.6 mm circular sample), which correspond to a delamination speed of 5.33 in/s (or 135.40 mm/s). In comparison, the average delamination speed of the mechanical delamination method was about 12.5 seconds for a length of 3 inches (76.2 mm)—for a 1 in by 33 in rectangular sample), which translate in a delamination speed of 0.24 in/s (or 6 mm/s).

Experiments have also demonstrated that delamination is easier (requires less debonding pressure or force) when the debonding structure comprises a debonding layer made of an oxide, a nitride, or a carbide, compared to when a single layer of metal is used. This can be seen when comparing the pressure required to delaminate samples with oxide, nitride, or carbide first layers to the pressure required for samples with metallic first layers, using a pressurized fluid. As shown from the table below, the average pressure required to delaminate a sample with a silicon dioxide layer is 50 PSI, while the average pressure required to delaminate a sample with a metallic layer is 75 PSI. The table also shows that the delamination speed when the laminate structure includes a non-metallic, inorganic debonding layer is greater than when a single metallic debonding layer is used. The pressures indicated are function of the same sample size, nozzle geometry and nozzle position. The combined use of a non-metallic, inorganic debonding layer with a pressurized fluid delamination process allows achieving delamination speeds over 100 mm/s, for debonding pressures lower than 50 PSI. At pressures of 50 PSI, delamination speeds of 135 mm/s have been achieved, while at 75 PSI, delamination speeds of 260 mm/s have been reached. Depending on the implementation, the delamination speed can be above 25 mm/s, and preferably above 35 mm/s, and more preferably above 100 mm/s.

TABLE 1

Table pressure and delamination speed comparing single layer metallic vs non-metallic, inorganic debonding layer

| Material | Pressure (PSI) | Delamination Speed (mm/s) | Delamination Completion (within 60 seconds) |
| --- | --- | --- | --- |
| Metallic | 50 | 0.1 | No |
|  | 75 | 135.0 | Yes |
| Oxide, Nitride, Carbide | 50 | 135.0 | Yes |
|  | 75 | 260.0 | Yes |

EXAMPLES

The section below provides non-limiting examples of the methods which have been described above. These examples will be referred to as a "first device fabrication method" and a "second device fabrication method", respectively. The following section should not be interpreted as being limitative and serves an illustrative purpose only.

The first device fabrication method includes a step of providing a modified growth substrate. The modified growth substrate includes an initial rigid substrate, which may include, but is not limited to a substrate suitable for microelectronics fabrication. Common examples of such substrates are alumina, steel, sapphire, barium borosilicate, soda lime silicate and alkali silicate. The modified growth substrate also includes a metal or metal alloy layer. The thickness of this layer may be 500 nm or less and is provided on the initial rigid substrate. The modified growth substrate also includes a silicon dioxide layer, which may have a thickness of 10 μm or less. This layer is provided on the metal or metal alloy layer. The modified growth substrate may comprise an additional layer, which may be made from material(s) having low water vapor transmission rate (WVTR) properties. The additional layer may be deposited using vapor deposition techniques. The first device fabrication method also includes forming a device substrate layer over the modified growth substrate and forming a stack of device layers over the device substrate layer. The stack of device layers may include polyimide. Once these steps are completed, the first device fabrication method includes performing interfacial debonding of the stack of device layers and device substrate layer from the modified growth rigid substrate to separate the stack of device layers and device substrate layer (i.e., the flexible microelectronics device) from the modified growth rigid substrate. The first device fabrication method also includes affixing the stack of device layers and the device substrate layer to a target substrate.

In some variants of the first device fabrication method, the metal layer is a relatively thin layer of nickel that may be deposited by sputtering. The silicon dioxide layer may be deposited using plasma-enhanced chemical vapor deposition (PECVD). The combined use of silicon dioxide and Ni may reduce the overall manufacturing costs, as Ni is typically more expensive than silicon dioxide. The first device fabrication method according to this example allows the production of flexible microelectronics devices having a transparent layer at the back of the device substrate layer. For example, the first device fabrication method includes using a layer of Ni having a thickness of about 25 nm as the metal layer and a layer made of silicon dioxide having a thickness of about 1 µm. Nonlimitative examples of low WVTR materials are SiNx, and Al2O3. In some variants of the first device fabrication method, the debonding may be carried out either in presence or absence of water as a catalyst. In some variants, the catalyst may penetrate between the flexible microelectronics device and the modified growth rigid substrate. Nonlimitative examples of catalyst that may facilitate the debonding process are water, acetone, isopropyl alcohol, Fluorinert®, water mist generated by spray paint nozzle head, and high-velocity air jets.

In some variants, layer(s) made of SiO2, Ni, SiN or any other materials with relatively low WVTR properties may be provided at a back side of the stack of device layers to act as an additional barrier protection layer. The barrier protection layer, which may be made from different barrier materials may provide protection against humidity.

The second device fabrication method according to this example includes a step of providing a modified growth rigid substrate. The modified growth rigid substrate includes an initial rigid substrate, which may include, but is not limited to substrates suitable for microelectronics fabrication. Common examples of such substrates are alumina, steel, sapphire, barium borosilicate, soda lime silicate and alkali silicate. The modified growth substrate also includes a metal or metal alloy layer. The thickness of this layer may be 500 nm or less and is provided on the initial rigid substrate. The modified growth substrate also includes a patterned silicon dioxide layer on the initial rigid substrate. The patterned silicon dioxide layer has a thickness of about 10 µm or less and has a patterned area ratio in the interval from 0% to 100% exclusive. The modified growth substrate may comprise an additional layer, which may be made from material(s) having low water vapor transmission rate (WVTR) properties. The additional layer may be deposited using vapor deposition techniques. The second device fabrication method also includes forming a device substrate layer over the modified growth substrate and forming a stack of device layers over the device substrate layer. The stack of device layers may include polyimide. Once these steps are completed, the second device fabrication method includes performing interfacial debonding of the stack of device layers and device substrate layer from the modified growth substrate to separate the stack of device layers and device substrate layer from the modified growth substrate. The second device fabrication method also includes affixing the stack of device layers and the device substrate layer to a target substrate.

In some variants of the second device fabrication method, the SiO2 layer has a thickness ranging between 130 nm to 1125 nm and has having thickness variations in the range of 10 nm to 25 nm, with the SiO2 layer being thicker in the center and thinner near the edges of the substrate. The debonding of the stack of device layers may be done in air and with the help of a jet stream as a catalyst.

In some variants of the second device fabrication method, the debonding may be carried out either in presence or absence of water as a catalyst. In some variants, the catalyst may penetrate between the device substrate layer and the modified growth substrate. Nonlimitative examples of catalyst that may facilitate the debonding process are water, acetone, isopropyl alcohol, Fluorinert®, water mist generated by spray paint nozzle head, and high-velocity air jets.

In some variants, layer(s) made of SiO2, Ni, SiN or any other materials with relatively low WVTR properties may be provided at a back side of the stack of device layers to act as an additional barrier protection layer. The barrier protection layer, which may be made from different barrier materials may provide protection against humidity.

The second device fabrication method according to this example may be used to manufacture electronic devices, optoelectronic devices, magnetic devices, electrode arrays, passive structures or micro-electromechanical systems, or any combinations thereof.

Examples of laminate structures manufactured according to the first or second methods include a rigid substrate, on which a nickel layer is formed, on which a SiO2 layer is formed, on which a flexible substrate layer is formed. Another example includes a rigid substrate, on which a SiO2 layer is formed, on which a flexible device substrate if formed, topped with a SiN layer. In possible implementations, the SiO2 layer has been replaced by a nickel layer.

Techniques for separating the flexible microelectronics structure from the rigid substrate.

Figure 12:
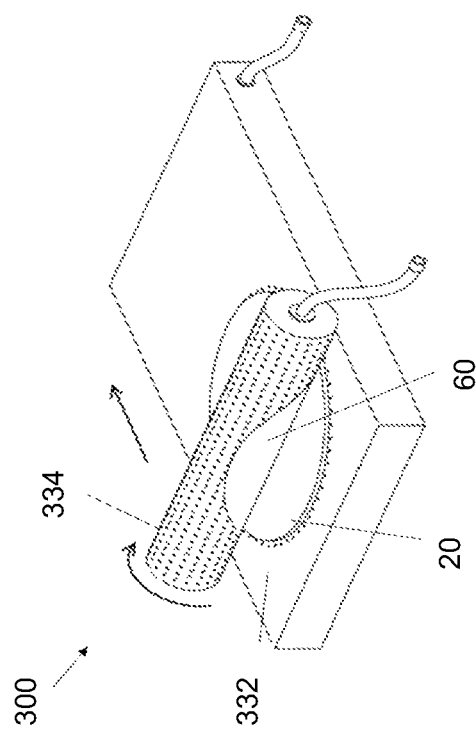
FIG. 12 is an illustration of an apparatus for peeling a flexible microelectronics structure from a rigid substrate, in accordance with one embodiment.
Figure 13:
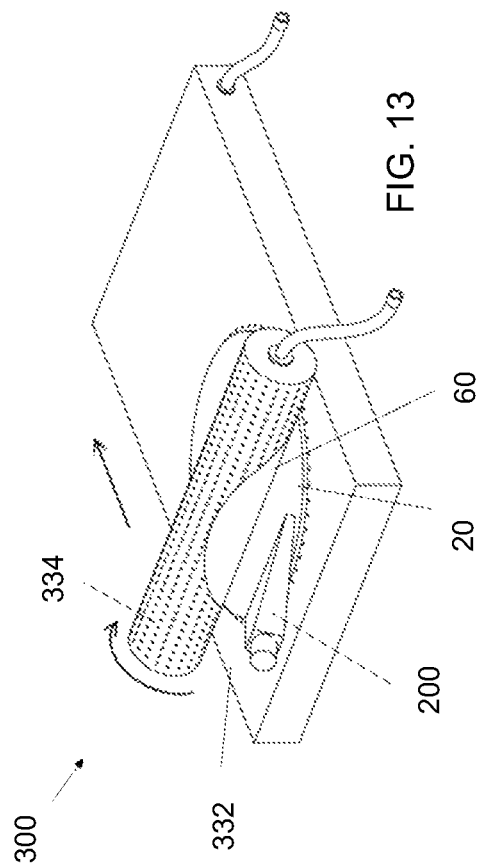
FIG. 13 is an illustration of an apparatus for peeling a flexible microelectronics structure from a rigid substrate, in accordance with another embodiment, where a fluid nozzle in used in addition to a vacuum roller.
Figure 14:
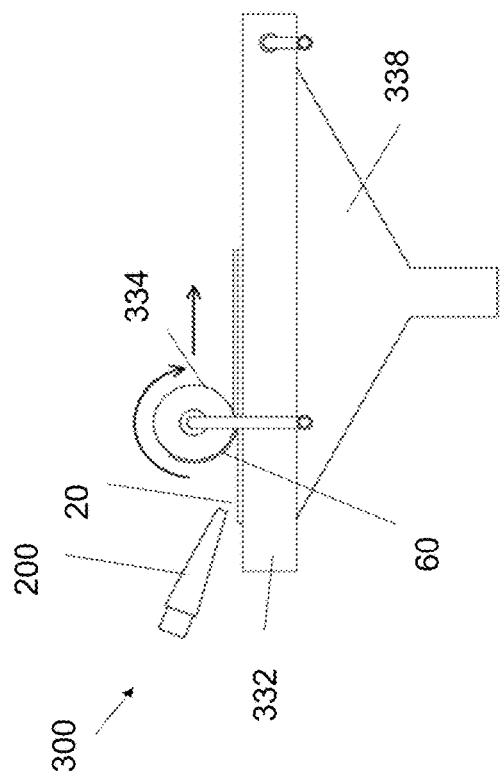
FIG. 14 is an illustration of an apparatus for peeling a flexible microelectronics structure from a rigid substrate, operated in a peeling mode, in accordance with another embodiment.

With reference to FIGS. 12 to 14, an apparatus 300 for peeling a flexible microelectronics structure 60 from a rigid substrate 20 will now be described.

In the embodiment depicted in FIG. 12, the apparatus 300 includes a holder 332 engageable with the rigid substrate 20. The holder 332 may be embodied by a sample holder or a sample stage and is sized for receiving and holding the rigid substrate 20 during the delamination of the flexible device structure 16. The holder 332 may be a vacuum holder. According to this method, separating of the flexible microelectronics structure from the rigid substrate is achieved by applying the debonding force with one or more vacuum-enabled surfaces on the laminate structure, at the first and second peeling interfaces. The vacuum-enabled surfaces can include a planar vacuum stage and/or a vacuum roller, for which the speed can be controlled and adjusted.

The apparatus 300 also includes a vacuum-holding roller 334. The vacuum-holding roller 334 is operable in a peeling mode to mechanically contact an outer surface of the flexible microelectronics structure 60 at an engagement region and apply a pulling force thereon. In some embodiments, the pulling force is a suction force. The vacuum-holding roller 334 is drivable to rotate along the surface of the flexible microelectronics structure 60, such that the flexible microelectronics structure 60 is peeled from the rigid substrate 20 by the pulling force at the engagement region and is retained or held on an outer lateral periphery of the vacuum-holding roller 334. In some embodiments, the vacuum-holding roller 334 has a diameter ranging from about 50 mm to about 500 mm. The apparatus 300 may further include a controller (not illustrated) for adjusting a rotational speed of the vacuum-holding roller 334. In some implementations, the rotational speed ranges from about 16 mm/s to about 25 mm/s.

In some embodiments, the apparatus 300 further includes a pump (not illustrated) for producing a partial vacuum. In these embodiments, the outer lateral periphery of the vacuum-holding roller 334 includes a plurality of openings. The openings are in fluid communication with the pump, such that the pulling force or the suction force may be applied to the flexible microelectronics structure 60.

Figure 15:
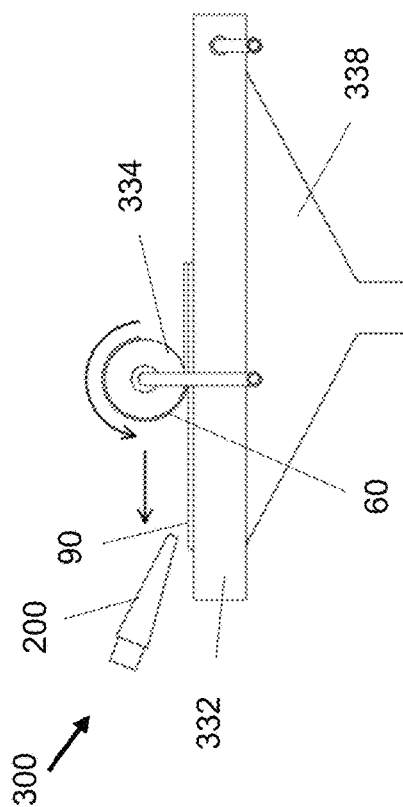
FIG. 15 is an illustration of the apparatus of FIG. 14, operated in a transfer mode.

Now turning to FIG. 15, once the flexible microelectronics structure 60 is peeled from the rigid substrate 20, the vacuum-holding roller 334 may be operated in a transfer mode. In the transfer mode, the holder 332 is engageable with a flexible host substrate 90, and the vacuum-holding roller 334 is operable to roll along a surface of the flexible host substrate 90, such that the flexible device structure 60 retained on the outer lateral periphery of the vacuum-holding roller 334 is transferred onto the flexible host substrate 90. The vacuum-holding roller can thus be operated to roll or unroll relative to the laminate structure, to suction the flexible microelectronics device structure thereon during delamination, and to release the flexible microelectronics device structure onto a host substrate by unrolling the structure thereon.

With reference to FIGS. 13 to 15, the apparatus 300 may include a fluid dispenser 200 positioned upstream of the vacuum-holding roller 334. The fluid dispenser 200 is configured to introduce, inject, or spray a fluid between the rigid substrate 20 and the flexible microelectronics structure 60, as the flexible microelectronics structure 60 is peeled from the rigid substrate 20. The fluid may be air, a water-based fluid, acetone, isopropyl alcohol, methanol, or a fluorocarbon-based fluid. In the embodiments wherein the fluid is a liquid, such as the one illustrated in FIGS. 14 and 15, the apparatus 300 may include a sink 338 for collecting the liquid, which may be useful when reusing the liquid catalyst is contemplated. Collecting the liquid catalyst may also reduce or eliminated the liquid residue(s) around and/or on the sample or device being manufactured.

In some embodiments, the apparatus 300 may further include an ion dispenser (not illustrated). The ion dispenser is configured to inject ions in the fluid or catalyst dispensed by the fluid dispenser 200, when the catalyst is a gas.

In other embodiments, the flexible microelectronics structure 60 and the rigid substrate 20 may be immersed in a bath before operating the apparatus 300 in the peeling mode. The bath may contain water, acetone, isopropyl alcohol, and Fluorinert®, or any combinations thereof.

Now turning to FIGS. 16 to 22, other features of the apparatus 300 will now be described.

FIG. 16 shows flexible microelectronics structure 60 on a rigid substrate 20, before the delamination. In some embodiments, the apparatus may include a cutting mechanism. In FIG. 17A, the cutting mechanism is embodied by a knife or a blade 400. Another example is illustrated in FIG. 17B, wherein the cutting mechanism is embodied by a laser 402. It will be noted that the cutting mechanism may also be physically separated from the apparatus and be provided as an additional module or with another device. In operation, the cutting mechanism may be operated to cut a portion of the flexible microelectronics structure 60 with respect to the rigid substrate 20. In some embodiments, the cutting mechanism may be operated to cut a sliver from the flexible microelectronics structure 60 and remove the same from the rigid substrate.

Once the sliver has been removed, the peeling or delamination of the flexible microelectronics structure 60 from the rigid substrate 20 may be performed. A nonlimitative example of a peeling initialization step is illustrated in FIG. 18, wherein the peeling is initialized with a knife or a blade 400. The knife can have a blade or can be an "air knife", that projects an air jet at high pressure/speed. This peeling initialization step results in a portion of the rigid substrate being exposed after the removal of the sliver. Of course, the peeling initialization step may be performed with other mechanisms. In some embodiments, the sliver has a width of about 5 mm or less. In some embodiments, the peeling is initiated with a knife edge operable to undercut a length of up to 5 mm to separate a small thin section of the flexible device structure from the rigid substrate and enable the vacuum-holding roller or similar holder to retain the peeled sliver in close intimate contact.

Figure 20:
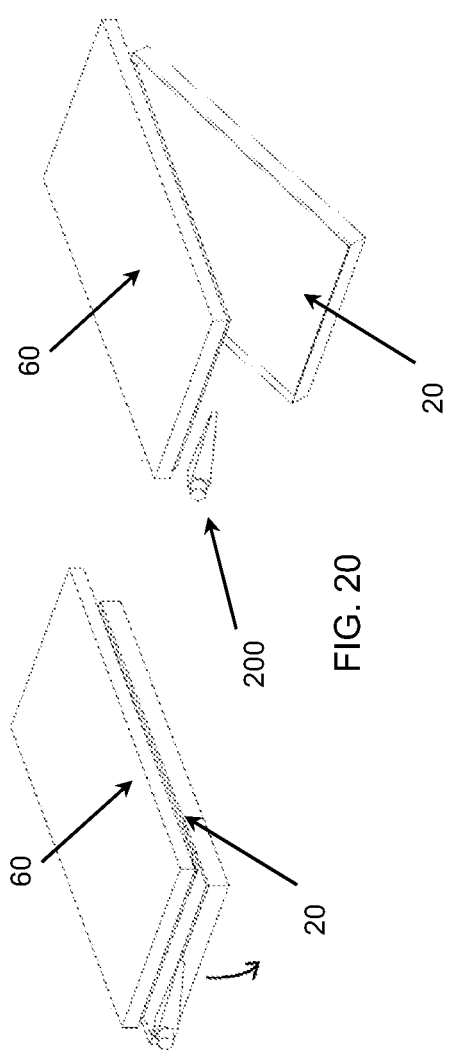
FIG. 20 shows that the peeling step initialized with the mechanism of FIG. 18 may be achieved with a vacuum stage and a fluid nozzle.
Figure 21:
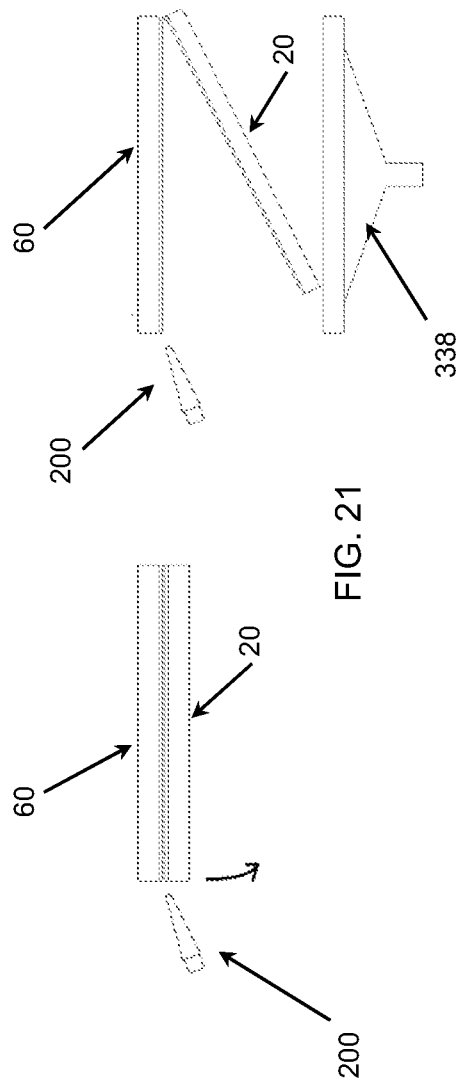
FIG. 21 shows that the peeling step initialized with the mechanism of FIG. 18 may be achieved with a vacuum stage, a fluid nozzle and a sink to collect catalyst fluids.

FIGS. 19 to 21 show different embodiments of the peeling or delamination step that may be achieved by the apparatus 300 or a component thereof. FIG. 19 illustrates the peeling step initialized with the mechanism of FIG. 18 may be achieved with a vacuum stage 340. FIG. 20 shows that the peeling step initialized with the mechanism of FIG. 18 may be achieved with a combination of a vacuum stage and a fluid nozzle 200. FIG. 21 illustrates that the peeling step initialized with the mechanism of FIG. 18 may be achieved with a combination of a vacuum stage 340, a fluid nozzle 200 and a sink 380. Roller 340 defines a line of pressure on the vacuum stage to facilitate controlled delamination when the vacuum-enabled interface is a stage and can be referred to as a "delamination line definition bearing and roller" or "peeling line bearing and roller". The function of the bearer/roller 340 is to bear either the weight of the vacuum stage or the pressure of the force on the stage while rotating/rolling to define the delamination/peeling line.

Figure 22B:
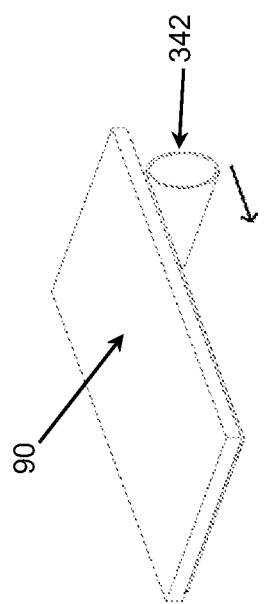
FIG. 22A-22B illustrates two possible embodiments of the flexible microelectronics structure being transferred on a flexible host substrate: one by means of a flat vacuum stage (FIG. 22A), and one by means of a roller (FIG. 22B).
Figure 22A:
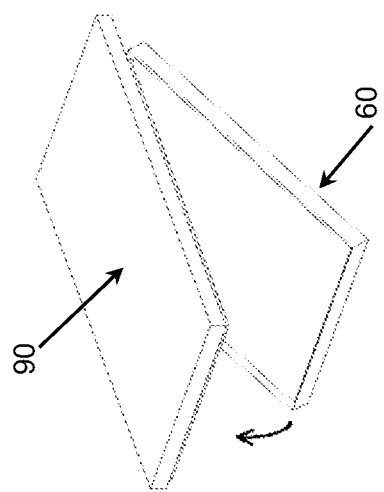

FIGS. 22A and 22B illustrate a possible embodiment of the flexible device structure being transferred on a flexible host substrate. In FIG. 22A, a planar stage is used for the transfer, while in FIG. 22B, a roller 342 can be used to unroll the flexible device structure on the host substrate 90.

One possible variant of the apparatus for peeling a flexible device structure from a rigid substrate will now be described. The apparatus may include a holder 332 engageable with the rigid substrate and a vacuum-holding stage 340. The vacuum-holding stage 340 may be planar or relatively flat. In a possible implementation, the size of the vacuum-holding stage may range from about 300 mm by about 400 mm to about 1500 mm by about 1850 mm. The vacuum-holding stage 340 is operable in a peeling mode to mechanically contact a surface of the flexible device structure at an engagement region and apply a pulling force thereon. In this variant, the pulling force originates from a relative motion between the vacuum-holding stage 340 and the holder 332, such that the flexible microelectronics structure 60 is peeled from the rigid substrate 20 by the pulling force at the engagement region and is retained on an outer periphery of the vacuum-holding stage. Of note, the peeling interface may be constantly maintained by the presence of a roller 342 underneath the stage holding the rigid substrate. The roller 342 may be controlled by a controller that determines a rotation speed of the roller. The rotation speed may range between about 16 mm/s to about 25 mm/s, but other speeds are possible Example The section below provides an example of an apparatus for peeling a flexible device structure from a rigid substrate and transferring the flexible device structure onto a flexible host substrate. The following section should not be interpreted as being limitative and serves an illustrative purpose only.

In this example, the apparatus includes a component having a curved surface. The component having a curved surface could have the shape of a cylinder, an egg, a ball, a cone, or any other shapes having a curved outer periphery or profile. Of note, only a portion of the outer periphery or profile of the component may be curved, and other portion(s) of the component may be flat or present a profile being different than a curved one. When the component is a roller, the diameter of the roller may range from about 50 mm to about 500 mm. The component having a curved surface may have holes through which a vacuum may be drawn.

The apparatus also includes a holder configured to hold a substrate with a vacuum, for example through holes formed in a sample holder. In operation, the vacuum is enabled and the component having a curve surface is placed in contact with a rigid substrate onto which is provided a flexible device structure. The component having the curved surface is then moved relative to the substrate at a peeling angle, which may range, for example and without being limitative, from about 45° to about 180°, to completely delaminate the device stack (i.e., the flexible microelectronics structure) from the rigid substrate. In some implementations, the peeling rate may range from about 16 mm/s to about 25 mm/s, as an example only Once the device stack is delaminated from the rigid substrate and held by the component having the curved surface, a receiving substrate (e.g., a flexible host substrate) may be placed in the holder, with vacuum enabled. The component having the curved surface may then be placed in mechanical contact with the receiving substrate, while holding the device stack. As the device stack is unrolled onto the receiving substrate, the vacuum of the component having is controlled, e.g., progressively disabled to release the device stack from the component having the curved substrate. As the component having the curve surface moves relative to the receiving substrate, the device stack is transferred and/or affixed to the receiving substrate.

Advantageously, the techniques and apparatuses described above may allow reusing the rigid substrate after the peeling delamination of the flexible device structure and its transfer onto the flexible host substrate. The reusability of the rigid substrate may be associated with reduced costs. The optional use of gaseous catalyst(s), which may be combined with ions, has been found to not only enhance the peeling process, but also to dissipate static charges that are typically generated during the transfer process. In terms of equipment, the apparatus herein described is scalable from a manufacturing standpoint. The integration of the fluid dispenser in the apparatus, for introducing the catalyst during the peeling process, is also scalable from a manufacturing standpoint. The apparatus is also compatible with liquid catalyst and allows the removal of the liquid residue(s) after the use of the liquid catalyst.

The techniques herein described may be eco-friendly, compatible with standard existing micro- or nano-fabrication processes and allow the fabrication of large area transparent displays, integrated sensors and display systems for aesthetic wearables, diodes, lighting, transistors, and the like.

Several alternative embodiments and examples have been described and illustrated herein. The embodiments described above are intended to be exemplary only. A person skilled in the art would appreciate the features of the individual embodiments, and the possible combinations and variations of the components. A person skilled in the art would further appreciate that any of the embodiments could be provided in any combination with the other embodiments disclosed herein. The present examples and embodiments, therefore, are to be considered in all respects as illustrative and not restrictive. Accordingly, while specific embodiments have been illustrated and described, numerous modifications come to mind without significantly departing from the scope defined in the appended claims.

Advantageously, the techniques and methods described above may allow reusing the rigid substrate after the peeling delamination of the flexible device structure and its transfer onto the flexible host substrate. The reusability of the rigid substrate may be associated with reduced costs. The optional use of gaseous catalyst(s), which may be combined with ions, has been found to not only enhance the peeling process, but also to dissipate static charges that are typically generated during the transfer process.

The techniques herein described may be eco-friendly, compatible with standard existing micro- or nano-fabrication processes and also allow the fabrication of large area transparent displays, integrated sensors and display systems for aesthetic wearables, diodes, lighting, transistors, and the like.

The following paragraphs list possible implementations of the methods described above and of the apparatuses that can be used to perform the methods.

In possible implementations, a debonding structure is provided, for debonding a flexible device structure from a rigid substrate, the debonding structure including a first layer for contacting at least a portion of the rigid substrate; and a second layer extending over the first layer.

In possible implementations, the first layer is made of metal or of a metal allow, including one of is Ni, Al, Cu or Pd.

In possible implementations, the first layer is formed by a physical vapor deposition process or a physical deposition process. The physical vapor deposition process can include sputtering, electron beam evaporation or thermal evaporation.

In possible implementations, the first layer is made of Ni and the physical deposition process includes electroforming.

In possible implementations, the first layer has a thickness of 500 nm or less.

In possible implementations, the second layer is a thin film layer made from an oxide material, such as silicon dioxide, or a nitride material, such as silicon nitride.

In possible implementations, at least one of the layers of the debonding structure comprises the single layer comprises silicon dioxide, silicon nitride, silicon carbide and/or silicon oxynitride.

In possible implementations, the second layer includes a plurality of patterns, said plurality of patterns may be uniformly distributed across a surface of the metallic layer or the rigid substrate.

In possible implementations, the second layer has a thickness of 5 μm or less.

In possible implementations, the debonding structure further includes an additional layer or a plurality of additional layers, extending over the first layer and/or the second layer. The additional layer may have moisture barrier properties and can be made of a thin film, for example having a water vapor transmission rate lower than $10^{-1}$ g/m$^2$/day, and preferably lower than $10^{-2}$ g/m$^2$/day and still preferably less than $10^{-5}$ g/m$^2$/day.

In possible implementations, a total thickness of the debonding structure is less and 15 μm, and preferably less than 5 μm or less.

In possible implementations, at least one layer is made from an inorganic material.

In possible implementations, a method of manufacturing a flexible microelectronics device is provided. The method includes forming a flexible microelectronics device structure on a debonding structure described herein, the flexible device structure including one or more substrate layers, one or more device layers and a one or more thin film encapsulation layers; peeling the flexible device structure from the rigid substrate or the second layer; and transferring the flexible device structure onto a flexible host substrate.

In possible implementations, peeling the flexible device structure includes separating an interface between a second layer of the debonding structure and the flexible device structure, or between the first layer of the debonding structure and the rigid substrate, and removing the peeled portion along with the flexible device structure.

In possible implementations, separation is achieved by the use of a mechanically displaced vacuum-enabled roller. In other embodiments, separation is achieved by the use of a mechanically articulated vacuum-enabled stage.

In possible implementations, the use of a controlled release of a pressurized fluid at a small, mechanically opened section of the interface between the second layer and the flexible device structure or between the first layer and the rigid substrate.

In possible implementations, the method comprises introducing an air jet between the first layer of the debonding structure and the rigid substrate, or between the second layer of the debonding structure and the flexible device structure during said peeling of the flexible device.

In accordance with another aspect, there is provided an apparatus for peeling a flexible device structure from a rigid substrate, the flexible microelectronics device being as defined above. The apparatus comprises a holder engageable with the rigid substrate; a vacuum-holding mechanism operable in a peeling mode to mechanically contact a surface of the substrate layer at an engagement region and apply a pulling force thereon, the vacuum-holding mechanism being drivable to rotate either along or away from the surface of the flexible device structure, such that the flexible device structure is peeled from the rigid substrate by the pulling force at the engagement region and is retained on an outer lateral periphery of the vacuum-holding mechanism; and a nozzle to introduce a fluid directly at the peeling interface to assist in delamination by injecting a catalyst, or to perform the delamination with air jets.

In possible implementations, the vacuum-holding mechanism is a roller.

In possible implementations, the vacuum-holding mechanism comprises a planar stage, the stage being supported by a roller defining the peeling interface.

In possible implementations, the apparatus of further comprises a controller for adjusting a speed of the vacuum-holding mechanism.

In possible implementations, the speed ranges from about 16 mm/s to about 25 mm/s.

In possible implementations, the apparatus further comprises a pump for producing a partial vacuum, and wherein the outer lateral periphery comprises a plurality of openings, said plurality of openings being in fluid communication with the pump.

In possible implementations, the apparatus further comprises a second holder for engaging a flexible carrier substrate, wherein the vacuum-holding mechanism is operable in a transfer mode to laminate the flexible device structure retained on its outer lateral periphery onto the flexible carrier substrate of the second holder.

In possible implementations, the apparatus further comprises a sink for collecting the fluid catalyst.

In possible implementations, the apparatus comprises an ion dispenser configured to injections in the fluid catalyst dispensed by the nozzle.

In possible implementations, a cutting mechanism, such as a blade or a knife, is operable to cut a sliver from the flexible device structure and remove the same from the rigid substrate.

In possible implementations, the mechanism introduces the pressurized fluid between the first and second peeling interfaces via one or more outlets. has an outlet or a plurality of outlets, the fluid jets being directed with an angle of 0 to 30 degrees relative to the surface of the rigid substrate.

In possible implementations, the mechanism that applies the pressurized fluid may be displaced such that the pressurized fluid is dispensed in between the rigid substrate and the first layer or between the second layer and the flexible device structure and the mechanism remains between 0.01 mm and 20 mm from the separation interface.

In possible implementations, the apparatus can comprise a second holder for engaging a flexible carrier substrate, wherein the vacuum-holding mechanism is operable in a transfer mode to laminate the flexible device structure retained on its outer lateral periphery onto the flexible carrier substrate of the second holder.

In possible implementations, the apparatus may comprise a flow regulator configured to select or adjust a flow rate of the fluid to achieve the delamination.

Several alternative embodiments and examples have been described and illustrated herein. The embodiments described above are intended to be exemplary only. A person skilled in the art would appreciate the features of the individual embodiments, and the possible combinations and variations of the components. A person skilled in the art would further appreciate that any of the embodiments could be provided in any combination with the other embodiments disclosed herein. The present examples and embodiments, therefore, are to be considered in all respects as illustrative and not restrictive. Accordingly, while specific embodiments have been illustrated and described, numerous modifications come to mind without significantly departing from the scope defined in the appended claims.

The invention claimed is:

1. A laminate structure used in the manufacturing of electronics devices, the laminate structure comprising:
   a rigid substrate;
   a flexible microelectronics structure comprising:
   at least one device layer; and
   at least one flexible device substrate layer;
   a debonding structure provided between the rigid substrate and the flexible microelectronics structure, the debonding structure comprising:
at least one debonding layer made of a non-metallic inorganic material,
the laminate structure comprising first and second peeling surfaces, at least one of the peeling surfaces corresponding to a surface of the debonding structure or to a surface within the debonding structure, the first and second peeling surfaces being peelable by a debonding force resulting from pressurized fluid delamination and/or from mechanical delamination applied during an initiation phase followed by a delamination phase, whereby:
   the initiation phase comprises a debonding force of more than 40 gF, and the delamination phase comprises a debonding force of less than 30 gF, thereby allowing separating the flexible microelectronic device from the rigid substrate.

2. The laminate structure of claim 1, wherein the at least one debonding layer of the debonding structure is a single debonding layer comprising one of: an oxide, a nitride, a carbide and an oxynitride.

3. The laminate structure of claim 1, wherein the at least one debonding layer has a thickness of 20 μm or less.

4. The laminate structure of claim 1, wherein the first peeling surface corresponds to the top surface of the debonding structure, and the second peeling surface corresponds to a bottom surface of the flexible microelectronics structure.

5. The laminate structure of claim 1, wherein the first peeling surface corresponds to the bottom surface of the debonding structure, and the second peeling surface corresponds to a top surface of the rigid substrate.

6. The laminate structure of claim 1, wherein said at least one debonding layer comprises at least a first debonding layer and a second debonding layer, the peeling interface being formed within the debonding structure.

7. The laminate structure of claim 6, wherein:
one of the first and second debonding layers comprises a metal or a metallic alloy; and
the other one of the first and second debonding layers comprises one of: an oxide, a nitride, a carbide and an oxynitride.

8. The laminate structure of claim 7, wherein said one debonding layer comprising metal or a metallic alloy comprises nickel (Ni) and the other debonding layer comprises silicon dioxide ($SiO_2$).

9. The laminate structure of claim 8, wherein the tensile stress between the first and second peeling surfaces is between 375 MPa and 625 MPa.

10. The laminate structure of claim 1, further comprising one or more additional layers extending between the at least one debonding layer and the flexible substrate device layer.

11. The laminate structure of claim 10, wherein the one or more additional layers have moisture barrier properties, with a water vapor transmission rate of $10^{-1}$ g/m²/day or lower.

12. A laminate structure used in the manufacturing of electronics devices, the laminate structure comprising:
a rigid substrate;
a flexible microelectronics structure comprising:
at least one device layer; and
at least one flexible substrate device layer;
a debonding structure provided between the rigid substrate and the flexible microelectronics structure, the debonding structure comprising:
at least one debonding layer made of a non-metallic inorganic material,
the laminate structure comprising first and second peeling surfaces, at least one of the peeling surfaces corresponding to a surface of the debonding structure or to a surface within the debonding structure,
said first and second peeling surfaces being peelable by pressurized fluid delamination applied at a delamination speed above 25 mm/s, allowing separating the flexible microelectronic device from the rigid substrate.

13. The laminate structure of claim 12, wherein the at least one debonding layer of the debonding structure is a single debonding layer comprising one of: an oxide, a nitride, a carbide and an oxynitride.

14. The laminate structure of claim 12, wherein the single debonding layer has a thickness of 20 μm or less.

15. The laminate structure of claim 12, wherein the first peeling surface corresponds to the top surface of the debonding structure, and the second peeling surface corresponds to a bottom surface of the flexible microelectronics structure.

16. The laminate structure of claim 12, wherein the first peeling surface corresponds to the bottom surface of the debonding structure, and the second peeling surface corresponds to a top surface of the rigid substrate.

17. The laminate structure of claim 12, wherein said at least one debonding layer comprises at least a first debonding layer and a second debonding layer, the peeling interface being formed within the debonding structure.

18. The laminate structure of claim 12, wherein the first and second peeling surfaces are peelable by the debonding force applied during an initiation phase at more than 40 gF, followed by a delamination phase with the debonding force applied at less than 30 gF.

19. The lamination structure of claim 12, wherein the delamination speed is above 100 m/s.

20. The lamination structure of claim 12, wherein the tensile stress between the first and second peeling surfaces is between 375 MPa and 625 MPa.

* * * * *